(12) United States Patent
Schroeder et al.

(10) Patent No.: US 8,645,900 B2
(45) Date of Patent: Feb. 4, 2014

(54) TOOL FOR THE TYPE AND FORM OF A CIRCUIT PRODUCTION

(75) Inventors: Michael Schroeder, Rodenbach (DE); Karl-Heinz Kuefer, Weilerbach (DE); Dmitry-David Polityko, Reutlingen (DE)

(73) Assignees: Fraunhoffer-Gesellschaft zur Foerderung der Angewandten Forschung E.V., München, Bavaria (DE); Technische Universitaet Berlin, Berlin (DE)

( * ) Notice: Subject to any disclaimer, the term of this patent is extended or adjusted under 35 U.S.C. 154(b) by 188 days.

(21) Appl. No.: 12/599,115

(22) PCT Filed: May 7, 2008

(86) PCT No.: PCT/EP2008/055658
§ 371 (c)(1),
(2), (4) Date: May 7, 2008

(87) PCT Pub. No.: WO2008/135596
PCT Pub. Date: Nov. 13, 2008

(65) Prior Publication Data
US 2011/0167399 A1 Jul. 7, 2011

(30) Foreign Application Priority Data
May 8, 2007 (DE) .......................... 10 2007 021 561

(51) Int. Cl.
*G06F 17/50* (2006.01)
(52) U.S. Cl.
USPC ............. 716/139; 716/54; 716/104; 716/106; 716/119; 716/126; 716/136; 716/137; 716/138

(58) Field of Classification Search
USPC ......... 716/104, 105, 106, 119, 126, 136, 137, 716/138, 139
See application file for complete search history.

(56) References Cited

U.S. PATENT DOCUMENTS 5,867,810 A * 2/1999 Miura et al. .................. 702/191
6,232,659 B1 * 5/2001 Clayton ........................ 257/724
(Continued)

FOREIGN PATENT DOCUMENTS

DE 102005041640 A1 3/2007
DE 10 2007 021 561 1/2009
WO WO2007/025753 A2 3/2007

OTHER PUBLICATIONS

International Search Report for PCT/EP2008/055658 mailed Dec. 1, 2008, 2 pages.
(Continued)

*Primary Examiner* — Helen Rossoshek
(74) *Attorney, Agent, or Firm* — Hunton & Williams LLP

(57) ABSTRACT

The invention relates to a method for influencing the selection of a type and form of a circuit implementation in at least one layer in a given integration task for at least one integrated circuit in a wafer composite, a module on a 2-dimensional carrier substrate, or a compact module. In one embodiment, a plurality of electric or electronic components are spatially arranged and to be electrically connected. Completed solutions x are stored in a database, and each of the completed solutions includes properties for the given integration task. The completed solutions define a destination space from which a solution is selectable by operating elements and determines a type and form of circuit implementation as a result of the given integration task, and aggregates the plurality of electric and electronic components in one of a plurality of integration technologies.

55 Claims, 19 Drawing Sheets

(56) References Cited

U.S. PATENT DOCUMENTS

| | | | |
|---|---|---|---|
| 6,829,754 B1* | 12/2004 | Yu et al. | 716/106 |
| 7,024,636 B2 | 4/2006 | Weed | |
| 7,146,579 B2* | 12/2006 | Gusikhin et al. | 716/106 |
| 7,181,383 B1* | 2/2007 | McGaughy et al. | 703/14 |
| 7,222,326 B2* | 5/2007 | Bohn et al. | 716/54 |
| 7,343,208 B2* | 3/2008 | Hoefler et al. | 700/83 |
| 7,523,429 B2* | 4/2009 | Kroyan et al. | 716/119 |
| 7,559,045 B2* | 7/2009 | Chen et al. | 716/106 |
| 7,823,116 B2* | 10/2010 | Chan | 716/104 |
| 8,191,032 B1* | 5/2012 | Wadland et al. | 716/136 |
| 2004/0098689 A1 | 5/2004 | Weed | |
| 2005/0023656 A1 | 2/2005 | Leedy | |
| 2005/0136419 A1* | 6/2005 | Lee | 435/6 |
| 2006/0126615 A1* | 6/2006 | Angtin et al. | 370/389 |

OTHER PUBLICATIONS

P. Schindler et al., "IP Repository, A Web based IP Reuse Infrastructure", Custom Integrated Circuits Conference; IEEE; May 16, 1999; pp. 415-418.

Peter Schindler, et al., IP Repository, IEEE 1999, Custom Integrated Circuits Conference, May 1999, pp. 415 to 418.

\* cited by examiner

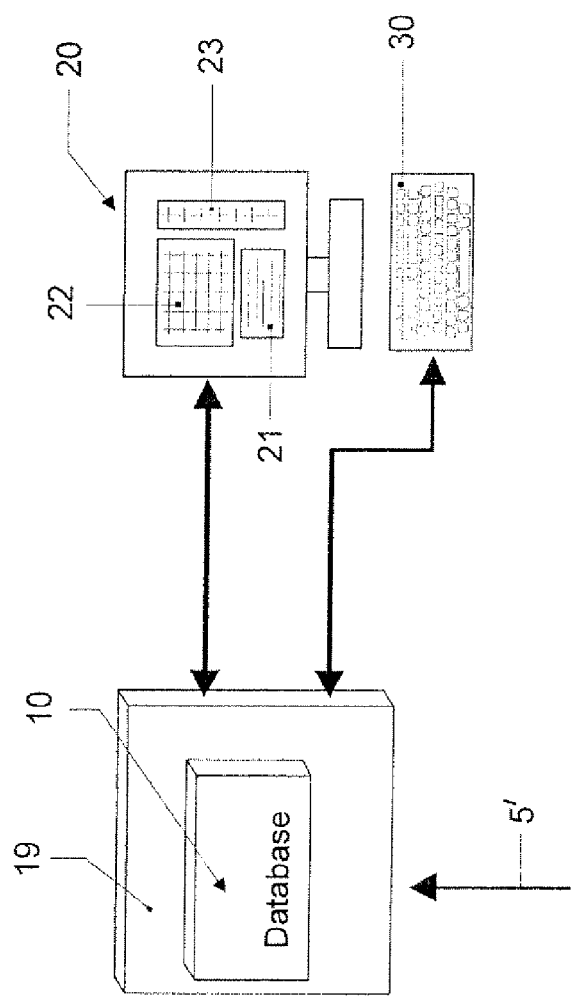
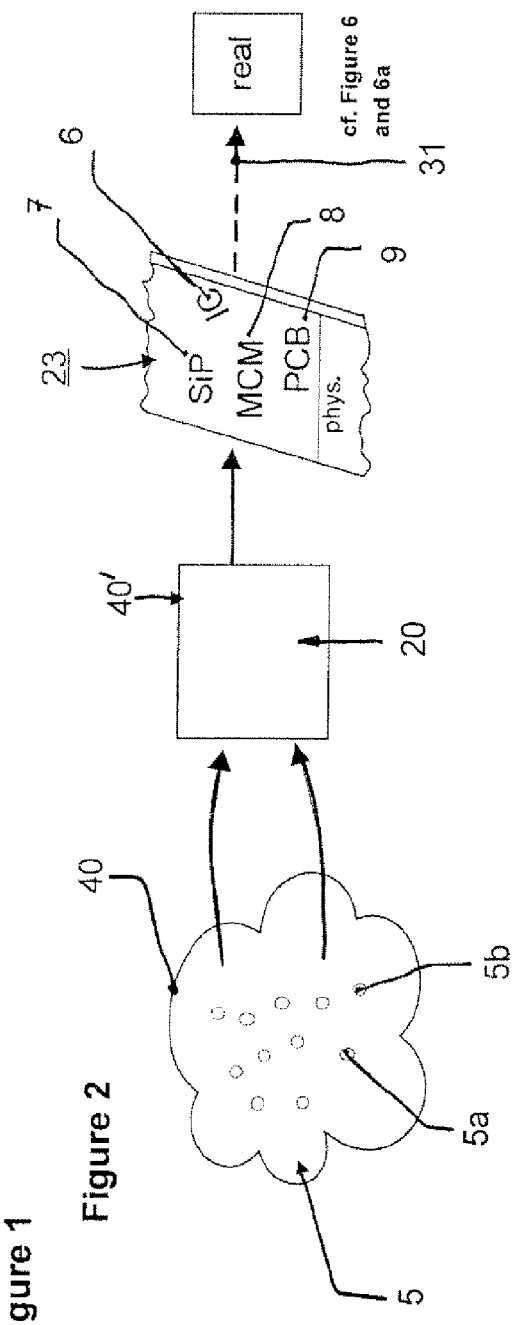
Figure 1
Figure 2

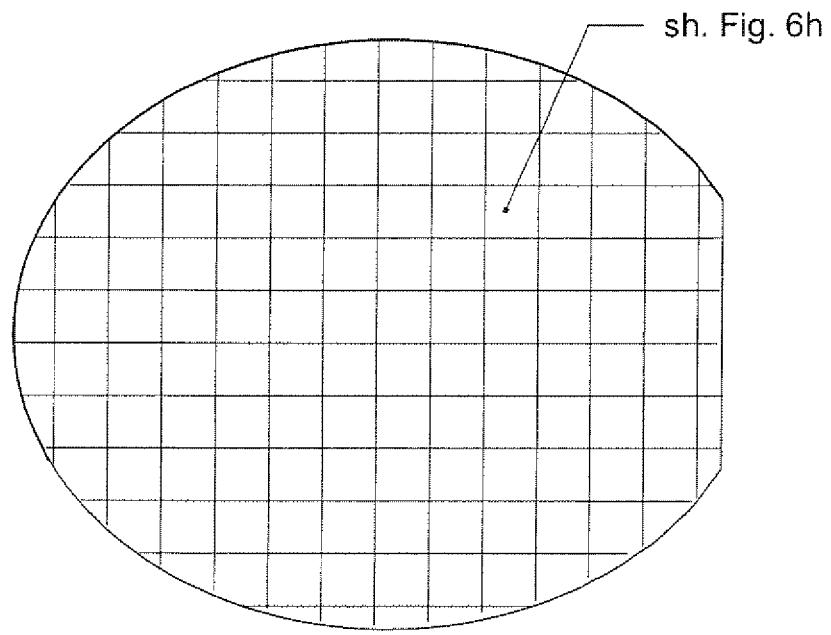
Fig. 6g
Fig. 6h
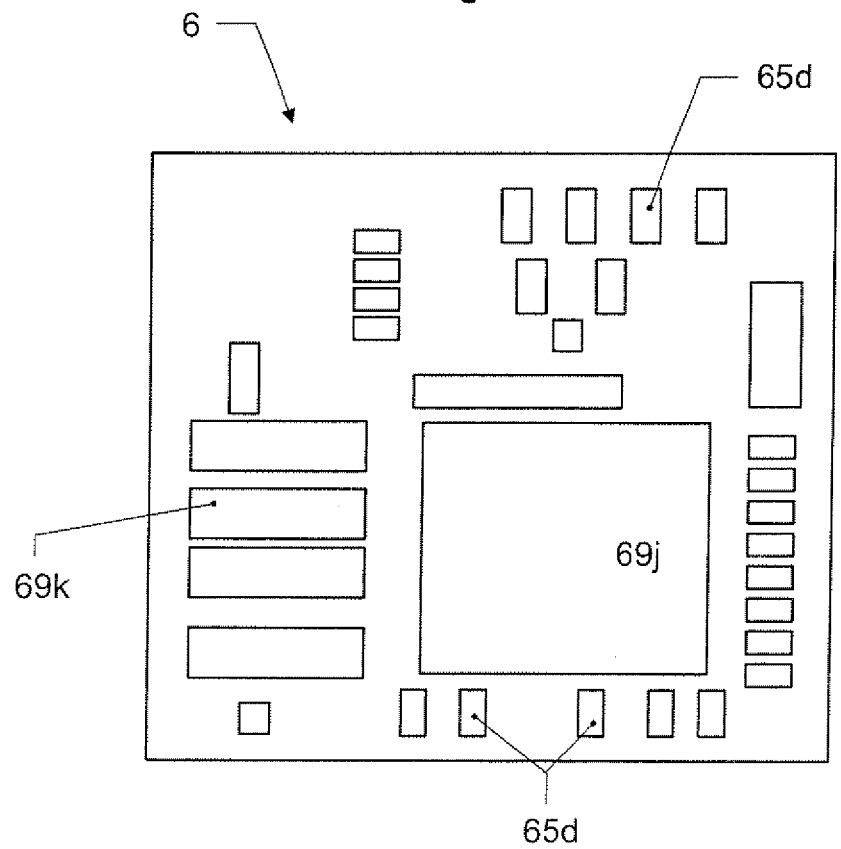

Properties

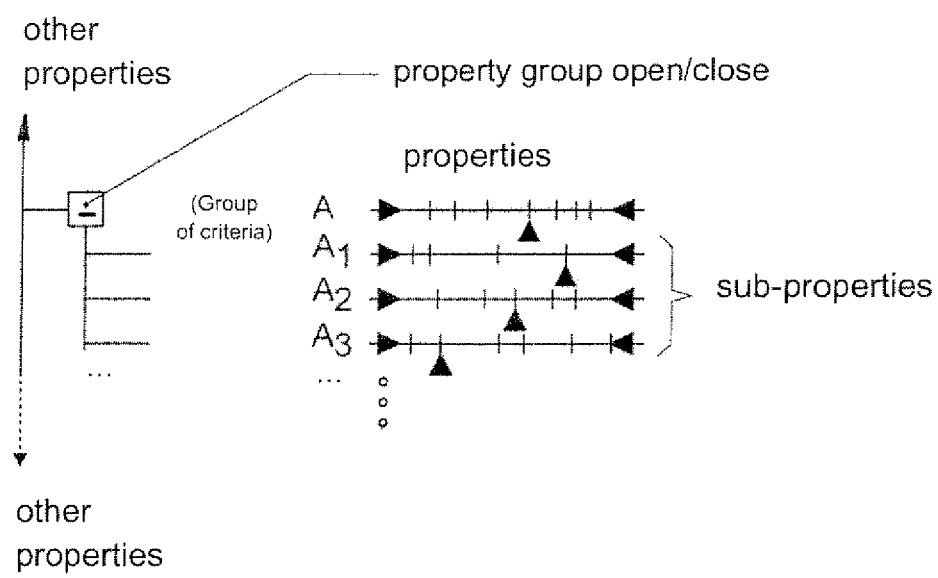
Figure 13
Figure 14
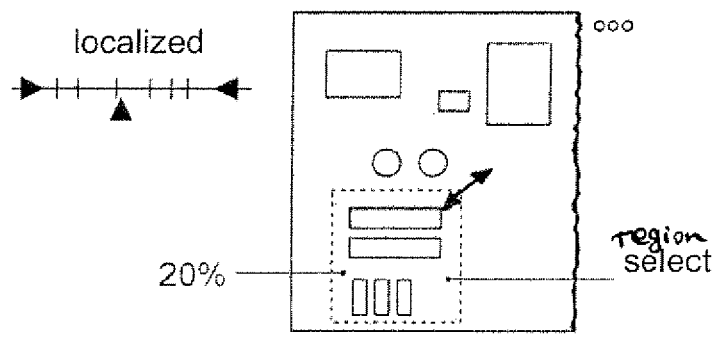

TOOL FOR THE TYPE AND FORM OF A CIRCUIT PRODUCTION

CROSS-REFERENCE TO RELATED APPLICATIONS

The application is a U.S. National Stage Application of International Application of PCT/EP2008/055658 filed May 7, 2008, which claims the benefit of German Patent Application No. 10 2007 021 561.6 filed May 8, 2007, the disclosures of which are herein incorporated by reference in their entirety.

The invention generally relates to the compilation of a plurality of electric or electronic components. This compilation may be understood as an integration, with which the plurality of electric/electronic components of a circuit is spatially arranged and electrically connected together, for which, for instance, a circuit diagram and a wiring plan exist, which, however, does not yet contain a spatial positioning of the corresponding components with respect to each other and within a three-dimensional space, if more than one layer of components is formed.

Also in a more general sense, this object may be understood as an "integration task", in which said components and the associated conductive interconnect plan have to be commonly "packaged" or have to be integrated without a package or have to be "packaged" when compiled to an assembly, which is presently realized by a designer, who designs a circuit concept in view of the technical implementation. This design task, for instance, comprises printed circuit boards, SIP (system in "package"), chips directly formed on an assembly (without encasing as a package) or ICs in a wafer composite or other integrated circuits. In other words, printed circuit boards may be understood as PCB, for example, compact assemblies may be understood as SIP and integrated circuits may be understood as SoC (system on chip).

In this case one assumes that this approach of "implementing an integration task" is allotted to the scientific-technical field that is referred to as electronic CAD (e CAD) or that stems from electronic design automation (e DA) or is assigned to it. This application is primarily effected by embedding into a chain of design tools, with which the electric or electronic system is designed. Also electro-mechanical components may be added to this electronic system. The electronic system (circuit), in particular as an electro-mechanical system, is thus the given "integration task or object", in which in at least one layer configuration (in the sense of a physical layer) the plurality of electric or electronic components is spatially arranged and electrically connected such that an enhanced design is generated. This generation of the "electric system" includes the solution of a plurality of partially diverging and concurrently not satisfiable requirements so that the type and form of the actually selected circuit implementation or realization is frequently a compromise among a plurality of possible implementations, each of which has one or more of certain advantages or a certain disadvantages. Not all of the criteria of such an implementation and before of a corresponding circuit design may be simultaneously optimized, rather pareto-optimised solutions are to be assumed.

In this case the type and form of the integration are determined such that they are "pareto-optimized" for an "integration task", thereby including that not every parameter or every property of this solved implementation is individually optimized.

During a design of the electronic system the described conventional techniques of eCAD do not lead to an optimized result upon establishing a first functional design. Rather, it is necessary that the chip designer (in the sense of the SiP or the PCB, too) establishes a design several times and verifies the result in view of its overall properties. This is effected by iteration loops of the development process, with which the design is changed and enhanced. The design of such an electronic system, thus, belongs to an optimization task, in which a plurality of satisfiable solutions may well be possible and form which the best possible solution has to be selected for the "integration task". In doing so it is not possible according to present design technology to concurrently view and a compare several circuit designs. In the eCAD tools that are to be considered a part of the prior art it is rather worked on a single design at a time, or this "integration task" is obtained as a design in order to achieve a real design solution that is subsequently to be analyzed in view of its properties in the entire system.

The associated available eCAD tools enable the calculation of only a single design proposal at a time upon placing ("auto placer") and routing ("auto router"). As a result thereof the design as such provided by the "auto router" or "auto placer" may be accepted or discarded only by the designer or the design team. A direct comparison between several complete alternatives (design proposals) is not provided in this case.

One illustrative example and a good comparison are obtained when a design phase and a design in the sense of a completed electronic system (as a physical design of an electronic/electric system) are explained, as is presently accomplished according to the prior art. In this case a printed circuit board is used as an example. The iterative determination of the final physical design of the electronic/electric system associated with the printed circuit board occurs after completing the circuit diagram or the netlist and the electric/electronic components specified therein, which represent the plurality of components (of electric or electronic nature) to be routed and placed. Upon completing the circuit diagram in view of its function and current routing the components associated thereto have to be placed. After placing also the connection of the components is to be established in the sense of an electrically conductive connection.

Presently, a first placing is effected manually or by means of an automated placing (an "auto placer"); to this end few coarse constraints, in no case all, are taken into consideration. Examples of such constraints are the lack of overlapping and the minimizing of the length of the netlist. The result of this process is a single placing proposal of all the placed or positioned electric/electronic components. This proposal is already the result of an iterative process, at first by considering the coarse constraints. This approach may be considered as a first "logic level" of the total design. A second logic level follows.

In the second logic level the routing of the conductors results from the given placing proposal by taking into consideration design rules and upon determining constraints. In this case the planned substrate technology plays a role for the former aspect of the "design rules". The substrate technology prescribes valid pitches between the conductor lines ("line space"), line widths, the number of wiring layers and, for instance, the type of desired vias (as a through contact between individual layers stacked above each other, layers in a physical meaning not in a logic sense). If the "design rules" are set, i.e., the constraints imposed by the selected substrate technology, further constraints may be added, for instance, for systems operating at high frequencies, analog or digital. Circuits comprising high-frequency components in an analog sense and circuits comprising high-speed systems in a digital sense initiate additional constraints. These constraints are provisions of requirements for certain nets and conductive lines. Examples thereof are differentially routed lines, impedance-adapted lines, length-adapted lines (for a concurrent signal arrival at several components), cross-talking sensitive lines and the like.

The routing plan arising from these two requirements, the design rules and the constraints (in the meaning of a routing step or a "routing") determines the routing of the conductive lines. For performing such a routing an automatic function (an "auto router") is used. Again, this "auto router" provides a single result, similarly to the auto placer when providing the placing proposal. This result may be entirely accepted or entirely discarded. In the latter case a new iteration of the total design process or only a new iteration of the routing step ("routing") is initiated.

The criteria for assessing whether the received result either of the placing proposal or of the routing proposal are accepted or discarded, may be the subject of further analysis, such as thermal simulations. If the designer wishes a homogeneous temperature distribution across the area of the physical design of the printed circuit board, he/she will search for an optimum in this respect and leave other optima, for example, an increase of the total dimensions at a reduced number of physical layers (the layers of the finished electronic system), for instance of the wiring layers in order to achieve a reduction in costs in this case. This is only one example for analyzing a design obtained, while many other examples are possible.

The situation described for printed circuit boards (PCB, flexible foil) may also be applied to the design of integrated circuits (IC, SoC) and for compact component modules (MOM, SIP, CoB—chip on board designs).

It is a technical object of the present invention to provide a novel design possibility for any integration technology, which reduces time consumption of the design, in particular the number of iterations required to establish a design, while nevertheless allowing to increase or enhance the quality of the design. This is not feasible by sequentially establishing only a few alternative designs.

The invention contemplates—for realizing this object—no less than inverting the (known) development path. The invention is based on the fact that completed solutions in great quantities are already available, which have been calculated in advance and which are completely stored in a database (of at least one computer) in the form of placing proposals and routing proposals. A plurality of these designs is provided, wherein the term plurality represents a very high number of items, for instance, more than 10, more than 100 or more than 1000 physical designs of an electronic system that is determined with respect to its concept but that is not yet determined in its physical implementation (the type and form of the circuit arrangement).

In terms of patent rights the invention manifests itself as a method (claim 1 or 60) or as a design tool (working tool) for the designer in the form of a display illustration (claim 65) on a display device consisting of one or more individual, yet operatively connected display devices (CRT, plasma, LED or any other preferably color displaying display devices).

The superior quality of the designs and the strong reduction of the required iterations for these designs are not obtained by sequentially providing some few alternative designs, which are then analyzed in view of their characteristics. Rather, according to the present invention it is the other way round. Completed designs are already available and these designs are searched for or quickly identify a best solution for the given "integration task" by a design tool (also: an EDA designer's development tool in the sense of a system or within the meaning of eCAD). A "tool" in this context is also software—illustrating efficiently and in a clearly arranged way technical entities—however in no way a computer program as such.

The invention enables to work at the highest level of abstraction by means of this "tool". The working may take place at the AVT layer or level (the layer of the construction and connection technique), to which are related a plurality of properties, techniques and associated costs. This AVT layer is a logic layer, no physical layer. The physical layer is that of the actual design space, in which a physical design of an electronic or electric or electro-mechanical system is provided in reality. According to the invention it is not operated on this design space by changing the layout, i.e., the placing of the line routing, but, detached from this layer—that is at first more understandable and easier perceivable for the designer—it is provided a superordinate layer of abstraction that merely conveys properties (claim 1). For each "completed solution" stored in the database a group belongs to these properties. A respective group of properties defines a plurality of completed solutions, wherein at least the following properties are included in each group: the technology, the number of layers (physical layers) of connections or wirings in a vertical direction, in particular two of these layers, the package size or installation size (representing the required area or volume for a number of layers greater than one), and the line length of conductive line length.

The plurality of completed solutions (from a respective group of properties) represents the destination space or that highest abstraction space that such an electric/electronic system can have (claim 1 or 60). The design to be finally realized is selected therefrom or based thereon.

To this end one of the solutions from the solution space is selected or addressed and is illustrated in the real design space after the selection (claim 2). For this purpose a display device is used, for instance an image forming apparatus consisting of one or more display devices. In this real illustration the actual spatial arrangement of the electric/electronic components and their physical electric connections, are imaged, in particular for each of the layers individually, such as one layer, two layers or three layers (claims 16 to 18).

The number of layers, which may be set in advance, relates to the physical layers, which are objectively present in circuit carriers in the form of substrate layers or wiring boards (claim 11). There may be provided three or four or more of such layers that are also referred to as physical layers. Such a physical layer may comprise at least two wiring layers (top side and rear side). In an integrated circuit the physical layers or levels may be the layers and between respective two layers may be a routing layer as a conductive line wiring layer.

The conductor layers and the circuit substrate layers are to be understood in a general manner. Mostly, two wiring layers are assigned to one circuit substrate layer (claim 18), and this holds also true for any multiples.

The designer is provided with a large number of alternative designs that he may identify and also select on the basis of abstract properties (claim 34, claim 5).

He may change the technology to be used (claims 8, 37, 38, 56), he may change the number of layers (physical layers) in the vertical direction, he may change the package size or installation size, he may "change" the line or conductor length that then results from the completed design. The designer does, however, not primarily select the completed design (the completed circuit design), but he considers much more abstract properties in the AVT layer which include at least the above-identified properties.

The "change" according to the previously indicated sense is not a change of a property value as such, but the selection of a new property value of a different solution. In this manner the property currently being considered is of course changed, but it is not changed in that sense that the user may enter a different value. He can select and use a different value from the solution in the database only. In the meaning of the above-described change of technology this change is the selection of a different technology for the same given integration task.

The aforesaid change concerns those properties which are represented in the first operating element. These are for a visual interaction, i.e., for operating "initiated by sight and enable" access of the destination space including all solutions. In this case also other property values may be stored in the solutions that are currently not available for visual interaction and are not represented in the first operating element, and hence are not selectably or switchably available for being plotted against each other or for a trade off in the second area-like operating element. Therefore, definitely only some properties of each of the completed solutions may be illustrated (claim 7). In other words, there are stored more properties in the completed solutions as are visually accessibly illustrated (claim 19 or 20).

The selection of the currently displayed property is adjustable (claim 20 or 38). The individual blocking of such properties so as to be not displayed distinguishes the property that is stored but not displayed from those properties that are stored and displayed.

It goes without saying that a blocked property is blocked in every group for the same property, and non-blocked, i.e., enabled properties, are enabled for being displayed in each group and thus for all completed solutions. The display in the first operating element is preferred, which is 1d or of linear nature, from which it is selectable as a displayed property for the 2-dimensional representation in the second operating element (claim 6 or 39), and is preferably switchable in the second operating element (claim 46).

The properties preset for being displayed may specialize to only certain technologies so that a pre-selection is already achieved by presetting the properties to be displayed (claim 37 or 39). This pre-selection may be established in an optical-interactive manner in a user-friendly way, if a certain number of technologies are displayed in a drop-down menu and it is to be preset, which technology is represented on the linear scale for the technologies. For example, ten technologies can be displayed in a meaningful manner only by being reduced to two to four certain technologies, which are preferably assessed against each other, verified and restricted to a best-possible technology for this given integration task.

This restriction, however, is a use and an activity, the presetting of the work equipment and the tools are themselves already to be considered as a complete invention, without the influence of the later actual operating activity.

This multi-criteria design approach does no longer leave the best-possible design in view of all given criteria of a "physical design of an electric system" to chance. The arrangement of the components (the respective position and orientation in one layer (of the real or physical layer)), the type and form of the circuit implementation, the routing design (the connection lines and their orientation between the displayed components) and the electric characteristics (caused by the routing according to the aforementioned results) are taken into consideration.

The navigation in the destination space (the controlling identifying of the destination) by being guided by said abstract properties that include the completed solutions generates one of the completed solutions as a result with superior efficiency and quality, which comes as close as possible to the desired and sought after optimum. This solution is one of the plurality of completed solutions stored in the database, which have been calculated in advance and stored in the database, without specifically assessing their quality and appropriateness to each other.

The display of a solution and the changing (claim 10) to a different solution (representative for a respective individual physical design of the electric system) are chronologically immediately adjacent, and are not caused by negating decision with a subsequent redesign with respect to a placing proposal and also a "routing" proposal.

The time interval between the visualization of an electric system and of another electric system, on the one hand visualized by the representation of the actual design space of the physical reality (claim 2) and on the other hand illustrated in the display device by the abstract properties of the group of properties of the destination space, allows the fast change, the fast comparison and the specific, time and quality related optimized identification of the best-possible physical design of the electric/electronic system as "given integration task". Destination space (AVT logic layer) and design space (physical images in the reality) are separated from each other by "no more than a mouse click". The navigation occurs from top to bottom, from the abstract space to the real representation, and not from the real representation (and its change) towards to an assessment of physically abstract properties.

The selection in the destination space enables to compare different actual "physical" design, both of which are available in the database in a pre-calculated manner and wherein by selecting a different value (scalar) it may be transited from one of the properties of the destination space (from the completed solutions) to a representation of a changed physical design, for example, precisely spoken a change of the conductor length by 10%, with an immediate illustration of the corresponding design, in which other properties of the at least four core properties of claim 1 may also be changed or have most likely been changed, and wherein again one of the pre-stored solutions is illustrated in design space of reality.

Associated design tools, which guide and direct these changes, are restrictions, selections, aggregations and localizations (claims 47 to 52). These are design tools with which it may be navigated in the solution space and thus completed solutions may be selected may be selected on the basis of at least the four core properties, which are then illustrated in the real design space on the display device. They commonly serve the purpose to reduce or assist in reducing the available multiple solutions towards a desired or best possible solution sought after (claim 57). This is referred to a "controlling of the set of stored solutions for being displayed", which themselves are not changed, but which are selectable due to certain interactive functions and which can be compiled to subsets, which enable a more precise targeting towards the best possible "type and form of the circuit implementation" (claim 55). Also a design may be established, which in no way has to be a best possible one (claim 54).

Certain graphic-interactive functions are covered by claims 47 to 52.

A restriction (claim 47) emphasizes the selected solutions with respect to the non-selected solutions, either by exclusive display or by change of contrast.

A restriction may relate to a subarea (claim 48). Each solution having a property value that corresponds to both properties that are currently being illustrated in a section, in particular in the second section of the display device within a subarea, remains selectable. Hence, it is restricted to these solutions.

A restriction in the meaning of presetting a path may result in a superior design of the current selection (claim 49). Starting from the origin that is illustrated in the second section of the display device with two properties and that represents one of the many solutions a further one of the many solutions in the path way is determined, which has property values as close as possible with respect to the origin. In this manner "larger steps" in terms of the properties currently being displayed can be avoided. These "significant" changes of a property value prevent the proximity of the next solution determined by calculation.

An aggregation is possible (claim 50). In this case several properties are compiled to a new property; die compiled properties have to be at least comparable. A change of the further property involves all the comparable properties of this set.

A localized property is possible (claim 34). The localization relates to a small part or a sub-section of the area of the design, preferable less than 20% (claim 52), With this integration function certain portions of the design may separately have an influence, for example, the conductor length in a narrow area or the heat generation in a certain portion of the design.

The integration technology carrier substrate comprises 2-dimensional circuit substrates (claim 9). Circuit substrates may be laminates, ceramics or thin films. In the integration technology compact modules there are used bonding techniques in the form of wire bonding or flip-chip (flipped chip, top down installation) or TAB. Stacked technologies or folded technologies result therefrom, wherein the circuit substrate or the conductor substrate is configured to be bendable in the folding technology (claim 11). An integrated circuit may be established in several ways, as a stand-alone circuit, as described below, or as a composite integrated circuit comprising a plurality of identical integrated circuits which are formed commonly on a wafer and which are to be separated later (claim 12). In particular, the compact module may comprise a micro circuit, as is the case in a chip on board technology.

The integration techniques "integrated circuit" or "compact module" also include embedding techniques as "embedded technologies" (claim 14). In the form of active and passive BE (embedded actives and passives), wherein the mounting does not take place on the surface of a circuit substrate, but into the circuit substrate (into the substrate). This describes the formation. However, the formation may also take place upon the fabrication of the circuit substrate (the fabrication of the substrate from the substrate materials and substrate structures), for example in hybrid technology or thick film circuitry.

Both techniques may be viewed with respect to the completed state. In the embedded technologies components are present in the 2-dimensional circuit substrate, i.e., along the height extension of the carrier substrate.

Not all of the integration technologies may be individually isolated at any time, but often circuit implementations may result, in which several integration technologies are commonly implemented, hence, an integration technology mostly with embedded technology, additionally with SMD (surface mounted devices), or a 2-dimensional circuit substrate, on which is mounted a functional chip comprising sophisticated functions.

Constraint management is possible with some of its property values (claims 43 to 46). The handling of several, in part contradictory constraints is referred to as a management, however, this represents a compromise between many requirements to be met, which, when representing strong requirements, are usually called design rules, and when representing violable requirements, are mostly called constraints. Examples therefor are the avoiding of passing through of placed components as a design rule that must not be violated, the presetting of minimum pitches of conductors in a selected technology, and violable or, in other words, constraints that are available for compromises, such as signal propagation time, signal integrity and other timing characteristics. The requirement that everything preset in terms of design rules and constraints is fulfilled in the "best possible" type and form of circuit implementation is wishful thinking, which is rarely completely, at best nearly completely, achieved. The set of properties may be supplemented with such properties that are appropriate for the constraint management. The constraint management thus becomes a member of the displayed properties that are provided for a selection process and an assessment. Constraints and design rules are global properties as well as local property values for certain areas. The number and the violation of timing characteristics are an example of global assessment properties. Also, the number and the violations of a given temperature profile for the entire circuit may be supplemented as a property value for each solution.

To this end they are plotted in the second section, which comprises a 2-dimensional graphic as an operating element. The plotting takes with place against another property. It is preferably selectable (claim 46), wherein the properties available for selection (selectable) or available for being switched are those properties that are illustrated in the first section as first operating element (claims 35, 36). The confrontation with the other property that is preferably switchable (or selectable) is established in the 2-dimensional operating element that occupies the second section of the display representation (claim 65).

Further property values for constraint management are the number of RC values extracted from given nets. They are extracted as discrete elements and may yield, as their number, a property value (claim 44). This constraint is preferably to be used in the integration technology of integrated circuits or the technology of the many integrated circuits in a wafer composite.

Further particularly preferred constraints (claim 45) are the number and the magnitude of deviations of given conductor lengths. This is to be taken into consideration for differential conductor routing. In an abstract sense, this may be described as "deviation from the length requirement". Alternatively of cumulatively the number and the strength of cross-talking of the signal may be incorporated into the property values. This influence factor called cross-talking may be used for lines and components and may be plotted against another property in a second section of the display device, e.g., in the operating element having a 2-dimensional character. Also alternatively or cumulatively to the aforesaid constraints are the number and strength of signal distortions. They serve to preserve signal integrity or to avoid distortion. Finally, alternatively or cumulatively may be added the number and the strength of deviations of given line impedances as a property value in each solution so as to be illustrated in the first linear operating element and to be able to be plotted against another property in the second 2-dimensional operating element. The latter also relates to a deviation from requirements, even a relative value, as the previously secondly indicated property for the purpose of constraint management (claim 45).

This numeration is not exhaustive, but may be completed. Particular examples are provided (claims 43 to 45).

Some terms should be explained (claim 1 and claim 60). The one layer is at least one layer and relates to the integration task and the associated technology of the actual integration of integrated circuits, modules or compact modules.

The number of layers, i.e., the substrate or the layer in an integrated circuit, may be one, two or more.

The number of layers that is at least included in the set of properties may be the number of physical layers as a circuit substrate, the number of integrated circuits or the number of layers of bond layers (claims 16 to 18).

A completed solution is a pre-calculated solution that is provided in a database for the confronted or given integration task. There are several solutions, in particular a great plurality, all of which are possible, however, not all of which are necessarily best possible solutions in the meaning of the user's destination route or the target requirement. According to his target requirement a "best possible" solution is then selected, which is taken over in a subsequent production process. This production process relates to the type and form of the circuit implementation that is associated with a given integration task. The integration task is the presetting of the circuit that is to be implemented.

Many integration technologies are stored in the database via the completed solutions and are accessible via the operating elements. The best possible circuit implementation, according to the user's view, in its type and form is to be fabricated in an integration technology, i.e., one of the many integration technologies, which kept ready by the completed solutions.

In doing so, the components are spatially arranged, in their location and position (orientation), wherein the position is also seen spatially and may be include a first, a second or any further layer. The connection is the electric connection that is preset by the circuitry. It is established in the layout proposal or later after producing the type and form of the circuit implementation according to the proposal.

For the sake of clarity at first the connection of the components stored together with the solution may be omitted in the real representation (claims 22, 58, 59). On the other hand, the contacts for contacting the circuit from outside or the vias may be treated like the positioned components and may be illustrated in the real design space together with the components (claim 59). Upon selection by a user the electric connection in the form of lines or other conductive connections may be additionally represented in the real design space.

Instead of a separate representation of each physical layer (claim 3) a single section of this layer may be presented. There is also an enlarged representation for a simplified or enhance acknowledgement of the real design space.

If the user changes from a first currently being presented solution to a next solution selected by him (claim 60), the newly selected solution replaces the previously presented one in the real design space. The representation of the real design space may also be presented in a delayed manner or may be provided upon request, by operating an activation section of the screen representation, which initiates the presentation of the real design space, either on the display or a plotter or printer.

The presentation of the destination space on the display device takes place differently for the 2-dimensional representation relative to the scale representation including linear operating elements. In the 2-dimensional representation all of the solutions having at least two properties are presented. In the 1d operating element all of the properties will be displayed.

A one-dimensional operating element is several scales (claim 35), each of which represents a property of all solutions. A parallel representation of scales is preferred (claim 36). Any other orientation of scales is also possible, such as a representation of spider net scales (claim 35).

The presentation of the 1d scales may be accomplished in a parallel manner side by side, or may include small angles. The parallel representation is advantageous due to its dense fullness of information (claim 36). This parallel orientation of the plurality of scales each of which represents a property, is, however, not necessary. Likewise, diverging scales emanating radially from a center, so-called spider net representations.

A two-dimensional representation is the area-like view for presenting a property value (a scale) relative to a different property value (a different scale), so that the mutual dependence may be evaluated (claim 39).

In a further variation also a spatial $3d$ representation may be obtained by adding a third property value. The 2-dimensional representation is thus not to be understood as exclusively 2-dimensional but as at least 2-dimensional (claim 40).

The presentation of two property values (claims 39, 40) may be completed by a third dimension, which does not need to presented spatially, but may be inserted by way of colors and size of dots in the 2-dimensional representation. The third dimension may visually initiating gain in influence in any other, non-geometric way. The described examples of the color and the size of plotted dots in an orthogonal system including two selectable properties provided a readily ascertainable visually advantageous basis.

The property values may be completed by a position presetting for a subset of the plurality of electric or electronic components (claim 26). This subset of the components defines a position presetting for the components, such as globally place them "near the edge", or an indication to position them in the center when possible, or the indication with respect to the placing in one of several layers, for instance in the upper or the lower layer. By these position presettings for this subset of components the thermal conditions and properties of the components may be taken into consideration. Thermally active elements are to be placed at the edge when possible or at the top or the bottom. Central processing units that serve or influence an entire system in the neighborhood are to be placed in the center as possible. Contacts for internal or external use are to be placed at the edge if possible. The described position presetting relates to all components or a certain smaller fraction thereof. This is different for a restricted local meaning (claim 51), which relates to few components only, which are arranged in a restricted area, for example in an area that occupies significantly less than 50% of the area of the physical layer. This localizing function was explained in the context with the graphically interactive functions (claims 51, 52).

These two properties can be distinguished by a local control of the placing and a global control of the placing.

A compilation of the three spaces (claim 42) in one or more operatively connected display devices forms, as an object or a patent subject "display device" (claim 65), the basis in order to put a user in the position to identify a best possible circuit if a type and form of a circuit implementation as fast as possible.

The display representation (claim 65) is a tool for reducing the design time for a type and form of a circuit implementation for a given integration task. The latter is called a circuit, the former is called type & form of the circuit implementation. Between the two items there is the display representation, which enables the user to transfer the one into the other, and by doing so to determine a best possible solution.

The plurality of completed solutions stored in the database comprise sets of properties, which may be the previously described properties. The display representation is not appropriate for a single integration technology, but allows the general usage of any construction and connection (AVT) technology or of any integration technology in the sense of an integrated circuit or of circuits compiled as wafer composite, which are many (identical) integrated circuits. Also technologies for embedding components in the circuit substrate and hybrid or thick film technologies are enclosed herein. Often it is not easy to assign a circuit implementation to exactly one technology, but mixed arrangements have to be allowed. SMD (surface mounted devices) may also be placed on embedded circuit technologies, however the technologies are distinguishable in their essential part. Here also the object of the given integration task is of importance. On the one hand, it may include the provision to implement an integrated circuit, on the other hand, it may include the provision to implement an integrated device as a stand-alone chip in the sense of an active device and thus becomes a CoB implementation, as an example. SoC circuits are a development of the early $21^{st}$ century, wherein an entire system is integrated in a chip and thus a complete application is embedded with small dimensions and manifold tasks.

The display operating elements are visible (claim 65, claim 1). These operating elements allow a destination space to be accessed, seen from another view, they map the destination space onto the operating elements. There are represented selected properties that are available in an operating element and properties selected from these operating elements may be plotted against each other in the second operating element. The operating activity takes place by being initiated by view. The representation, i.e., the display presentation, enables the selection initiated by view. It itself is already configured to initiate further selections which also could describe a development path initiated by view that leads from one solution to the next one and to a further one. Each of these solutions, which has been illustrated in the operating elements or has been selected by the operating elements, is presented in a real design space, wherein in this design space the physical representation, i.e., the physical arrangement of the electric and electronic components is accomplished no longer in an abstracted but in an objectively perceivable presentation. At least one layer is illustrated. If several layers are provided, also several layers may be presented for the user in a visible manner.

The spatial arrangement of a component (claim 22) relates to the respective position and its orientation in a respective physical (or physically objective) layer. The connecting lines in the form of conductors or other conductive connections may be additionally made visible or at first may remain without a specific representation in the real design space for the benefit of an enhanced overview.

The display representation (claim 65) includes for the property preferably four properties, which include the technology for the integration (claim 66).

The invention is explained and supplemented by way of illustrative embodiments, wherein it is to noted that the following presentation is the description of preferred embodiments of the invention.

FIG. 1 is a block diagram of an example of an implementation.

FIG. 2 illustrates a system concept including logic spaces 40, 23 or 40' and 23 (also referred to as logic elements).

Figure 3:
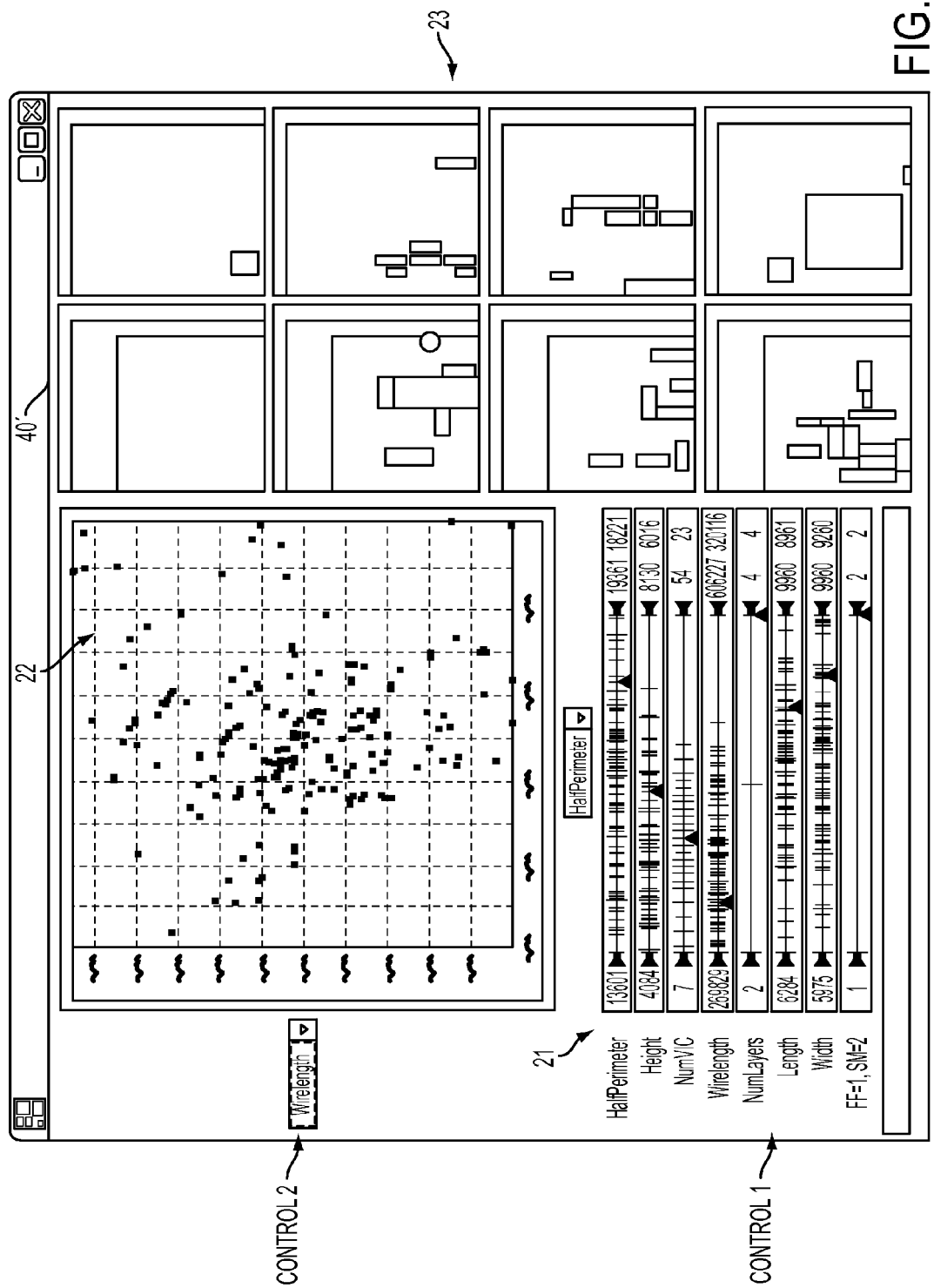
FIG. 3 illustrates the way of operation to be explained of the system including the logic spaces on the basis of a representation of on a screen as a display device (nowadays: display).
Figure 3A:
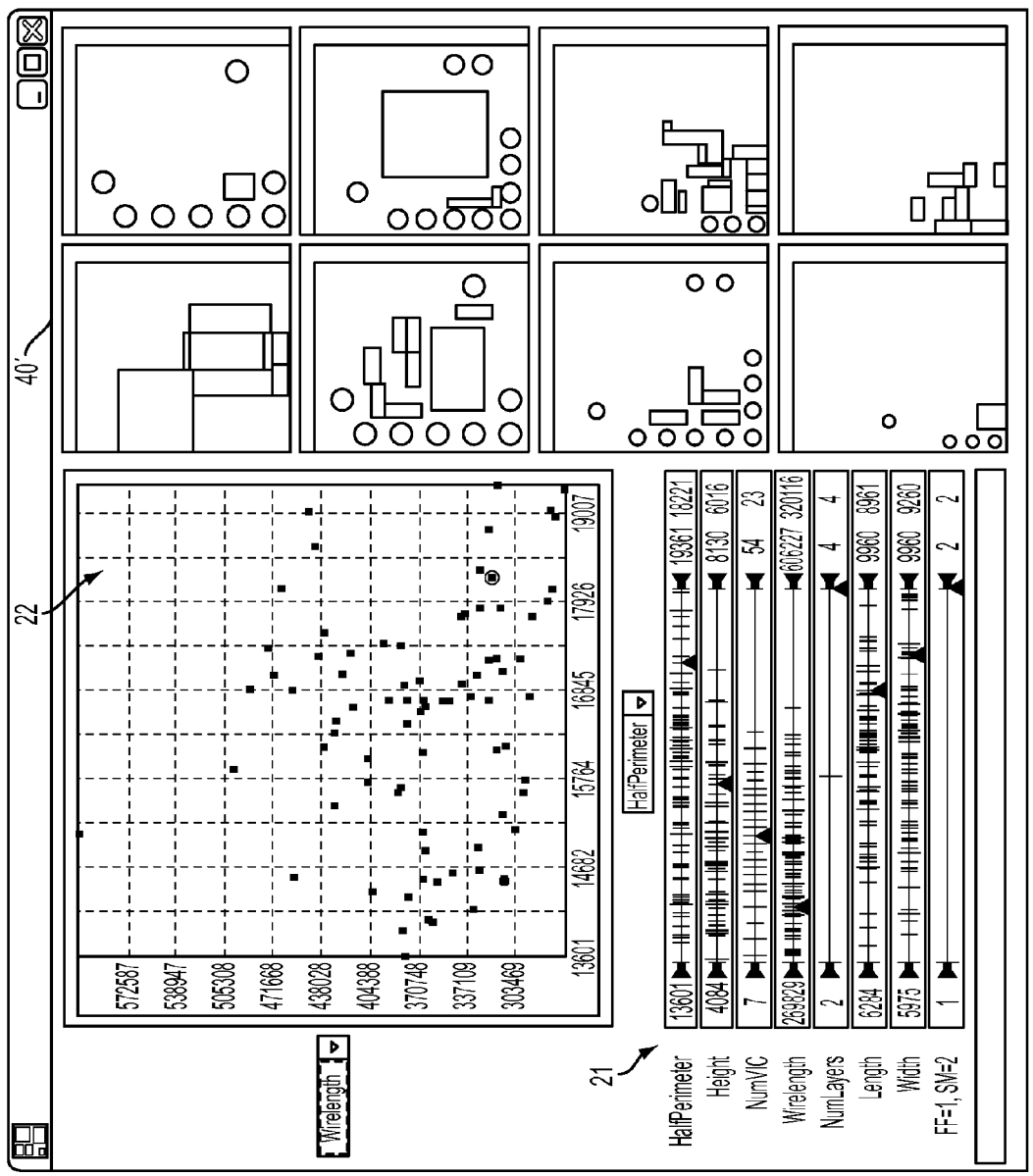

FIG. 3a clarifies with higher resolution the operating elements 21,22 of FIG. 3 and the spaces 40',23, the latter one as the real design space.

Figure 4:
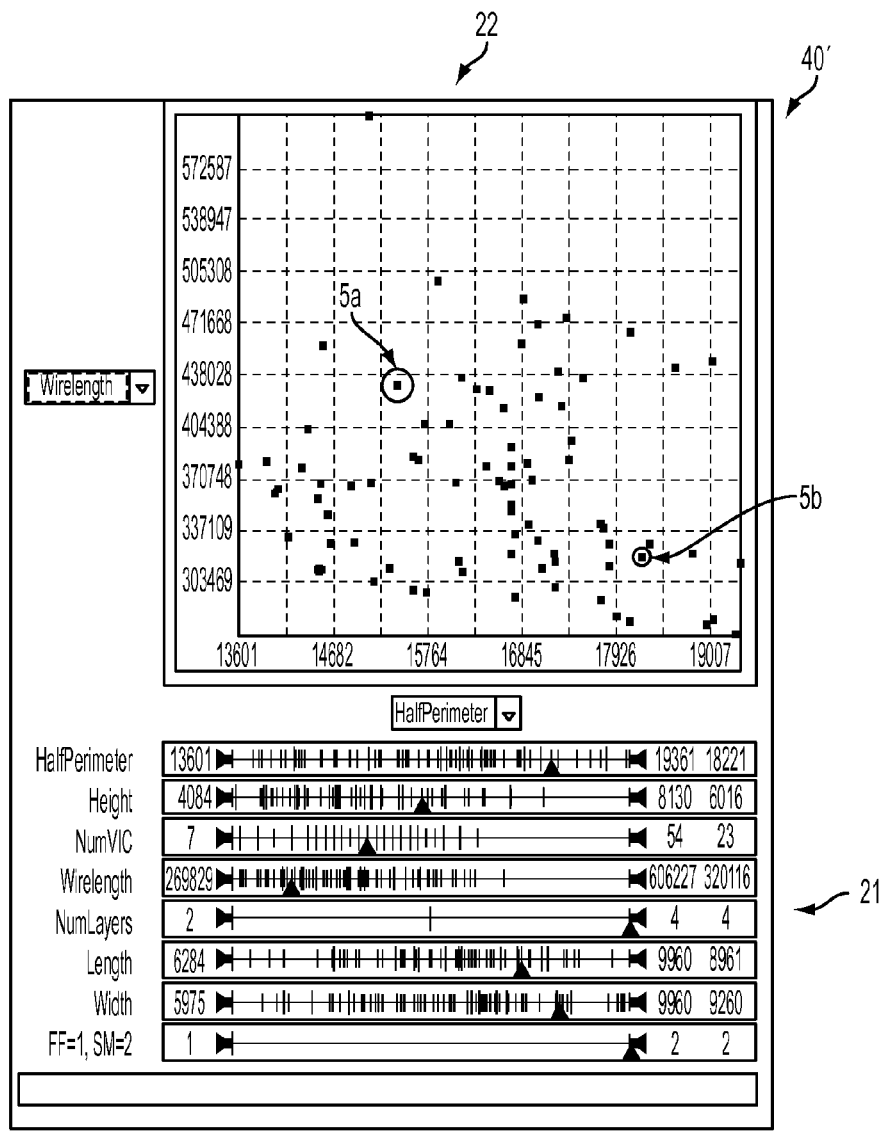

FIG. 4 is a section of FIG. 3 including the highlighting of the space 40' and the operating elements 22,21.

Figure 5:
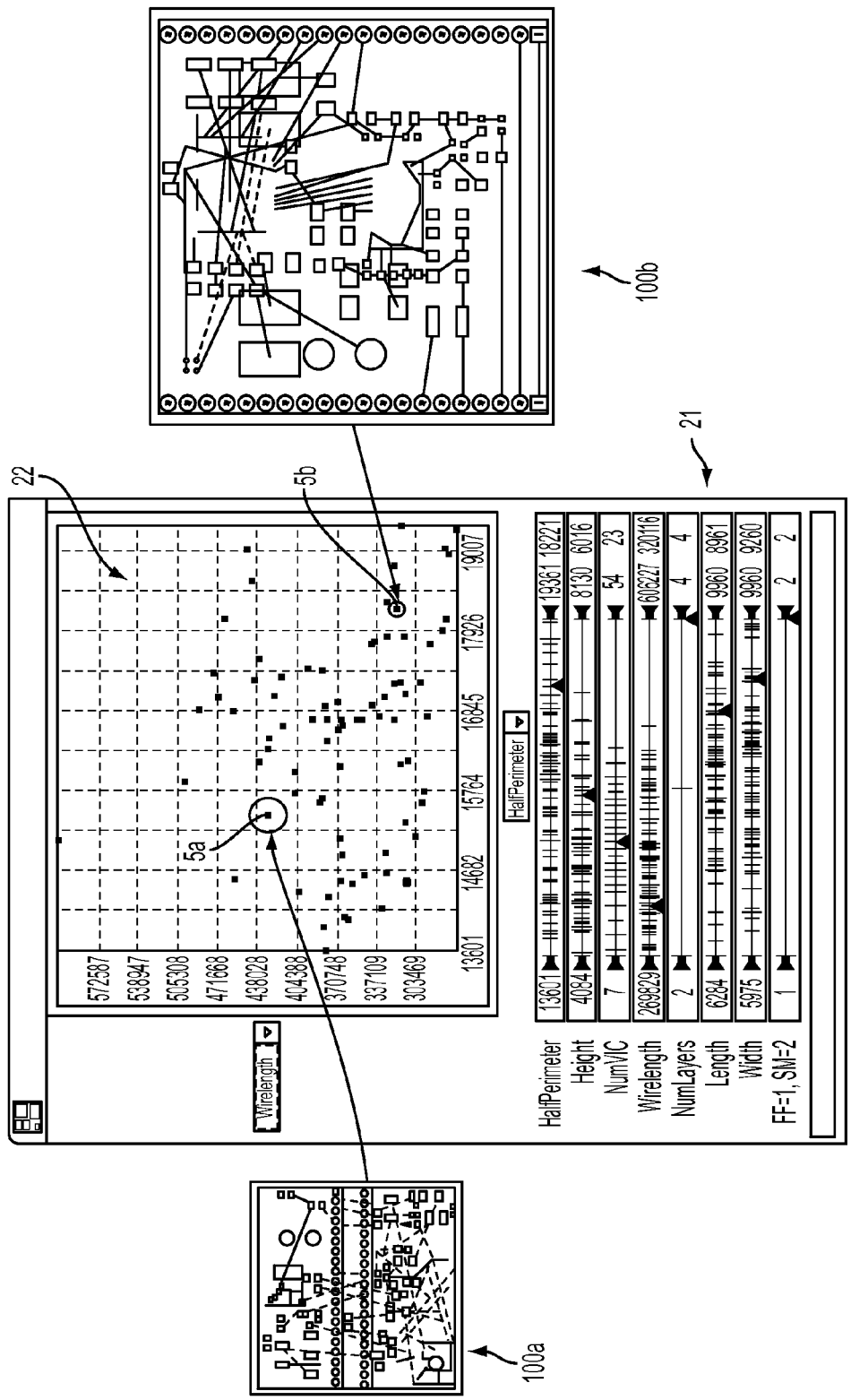

FIG. 5 is FIG. 4 with respect to real layouts 100a, 100b of types and forms of circuit implementations. Two solutions 5a, 5b are highlighted and assigned to specific layouts, solution 5a to the layout 100a and solution 5b to the layout 100b.

Figure 6A:
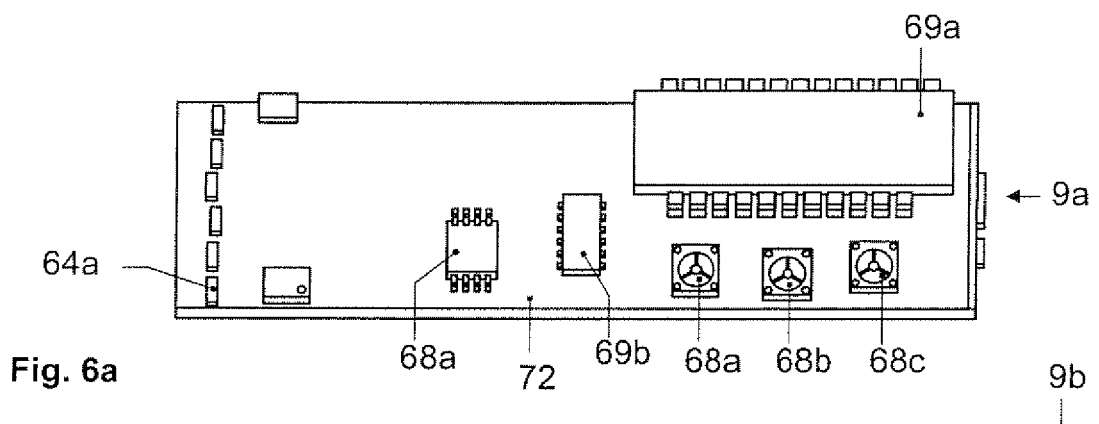
Figure 6B:
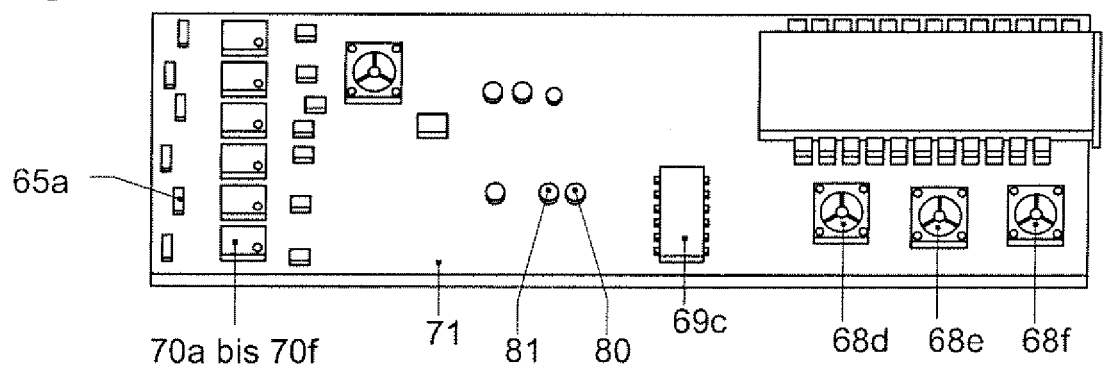
Figure 6C:
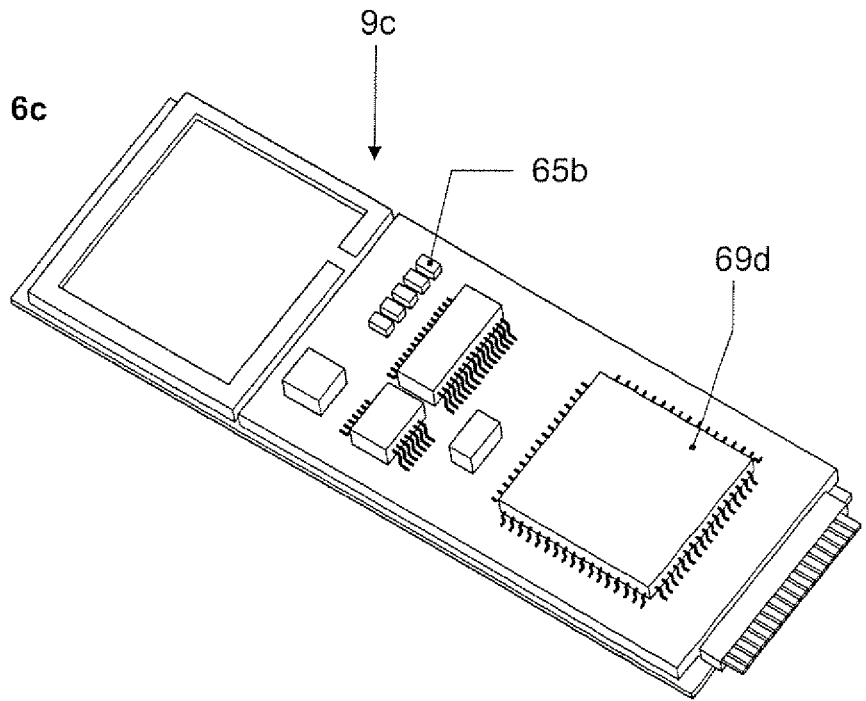

FIG. 6a,

FIG. 6b,

FIG. 6c are several types and forms of printed circuit boards circuit implementations (PCB as Printed Circuit Board) and individual components placed therein according to position and orientation.

Figure 6D:
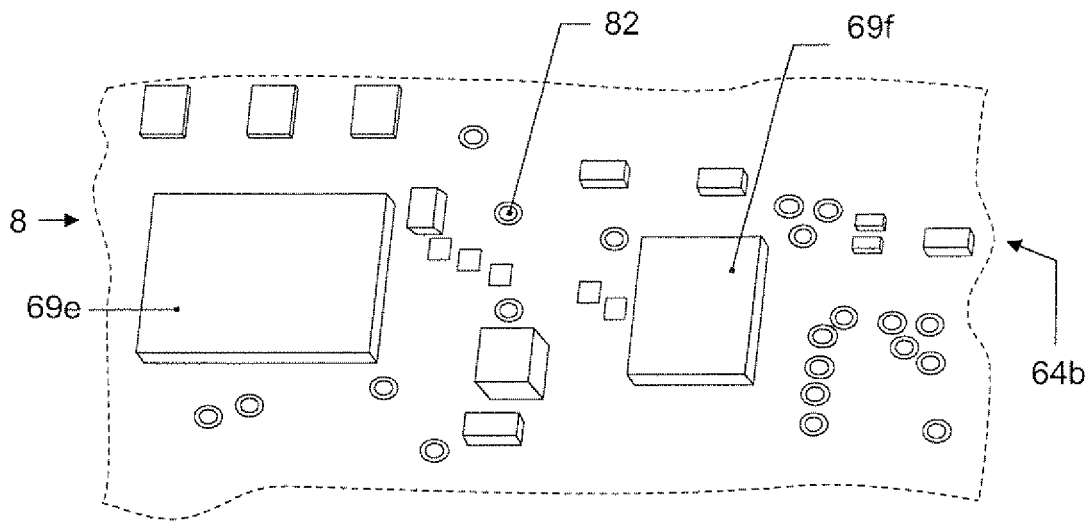

FIG. 6d is an example of a multi-chip module (MCM) including components arranged therein as a further embodiment of the type and form of a circuit implementation.

Figure 6E:
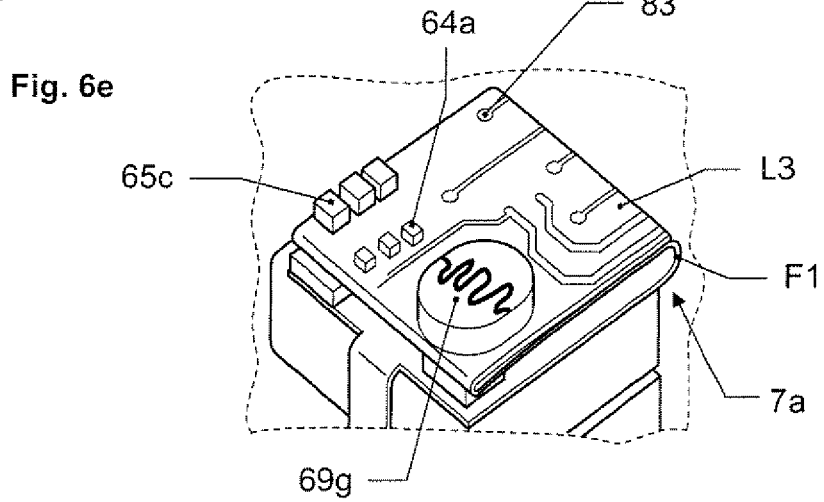

FIG. 6e is a representation of a further type and form of a circuit implementation in the form of a folded 2.5 D SIP, also including components arranged thereon.

Figure 6F:
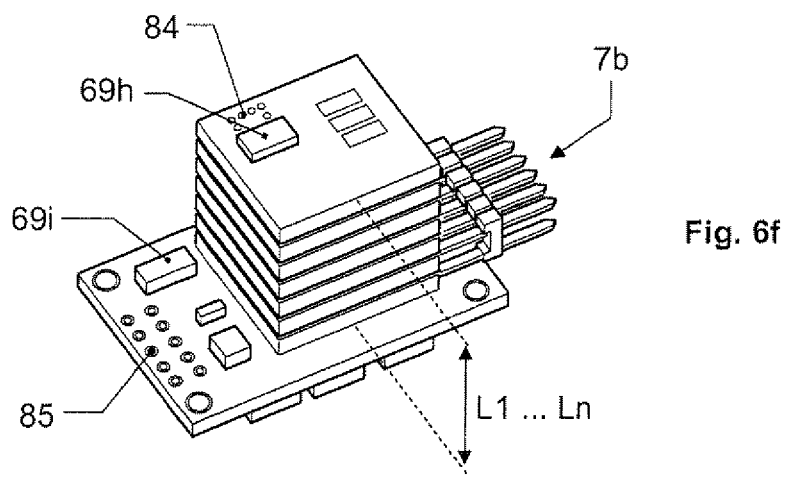

FIG. 6f is a further type and form of a circuit implementation, here in the form of a stacked SiP, comprising several layers of rigid circuit substrates.

FIG. 6g,

FIG. 6h are further types and forms of circuit implementations, here as integrated circuits, as a wafer including many identical circuits, which are shown in an extracted manner as a surface structure in the section of FIG. 6h.

Figure 6I:
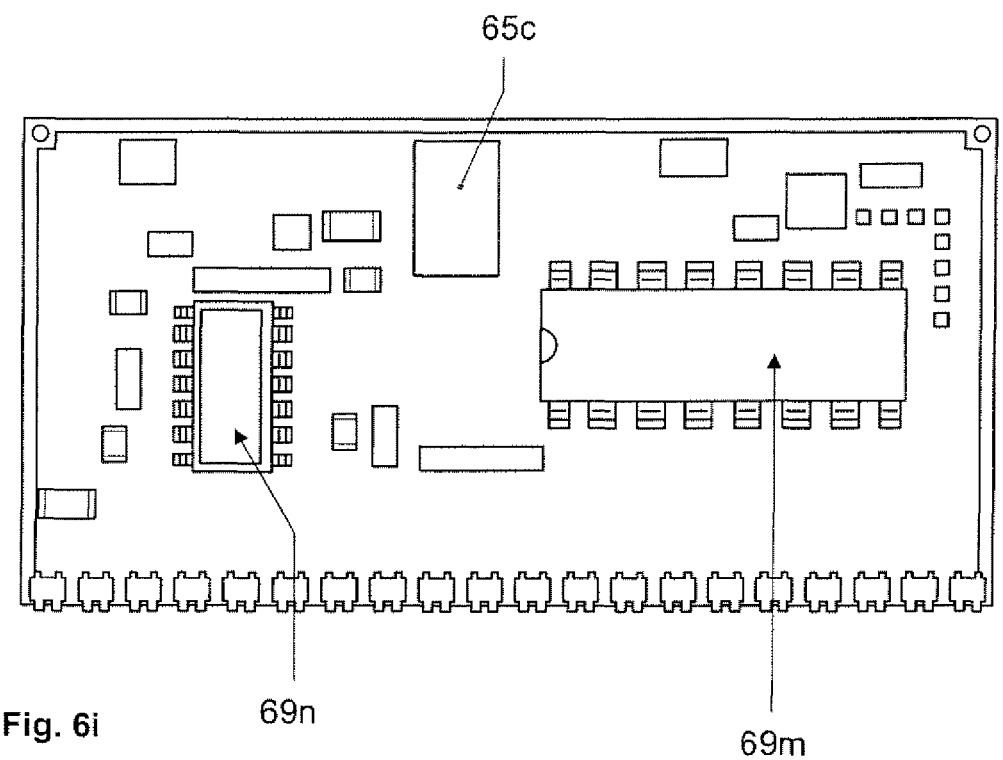
Figure 6J:
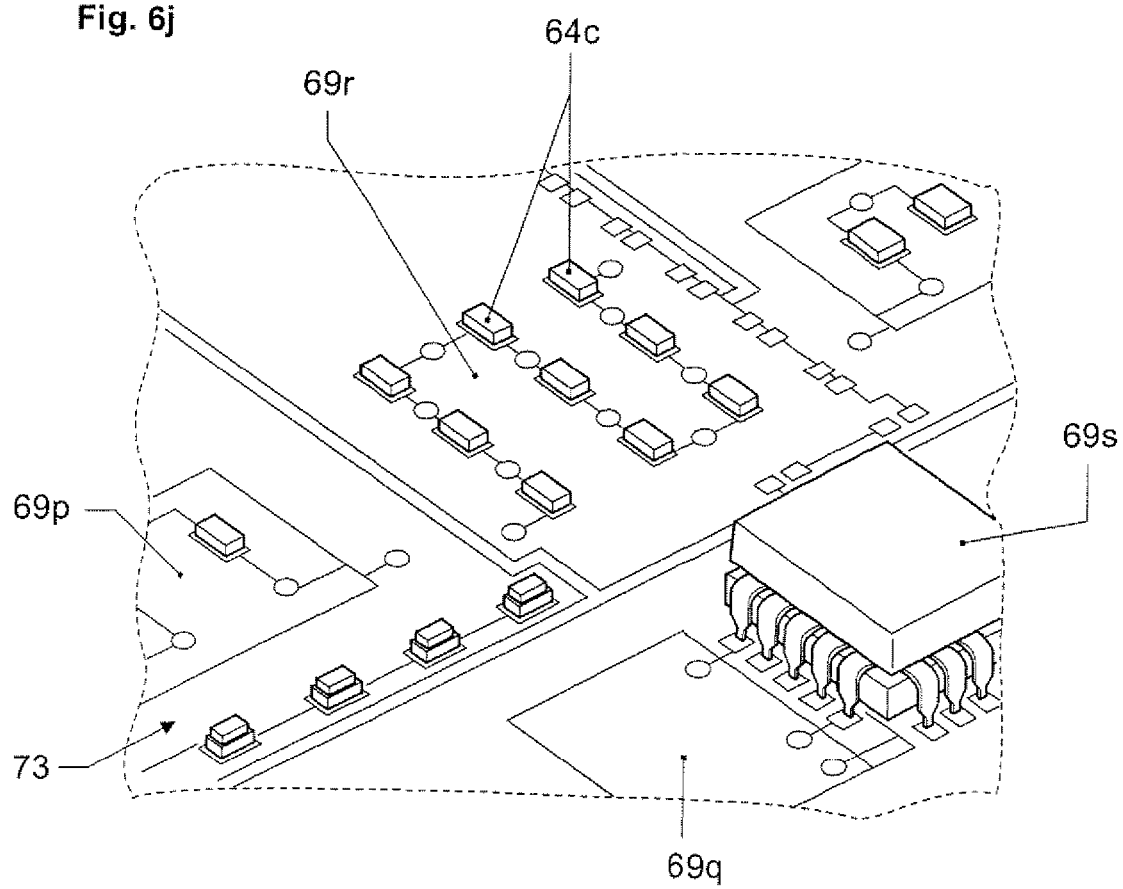

FIG. 6i,

FIG. 6j are further types and forms of circuit implementations, here as hybrid circuits and in FIG. 6j as embedded technology.

Figure 7:
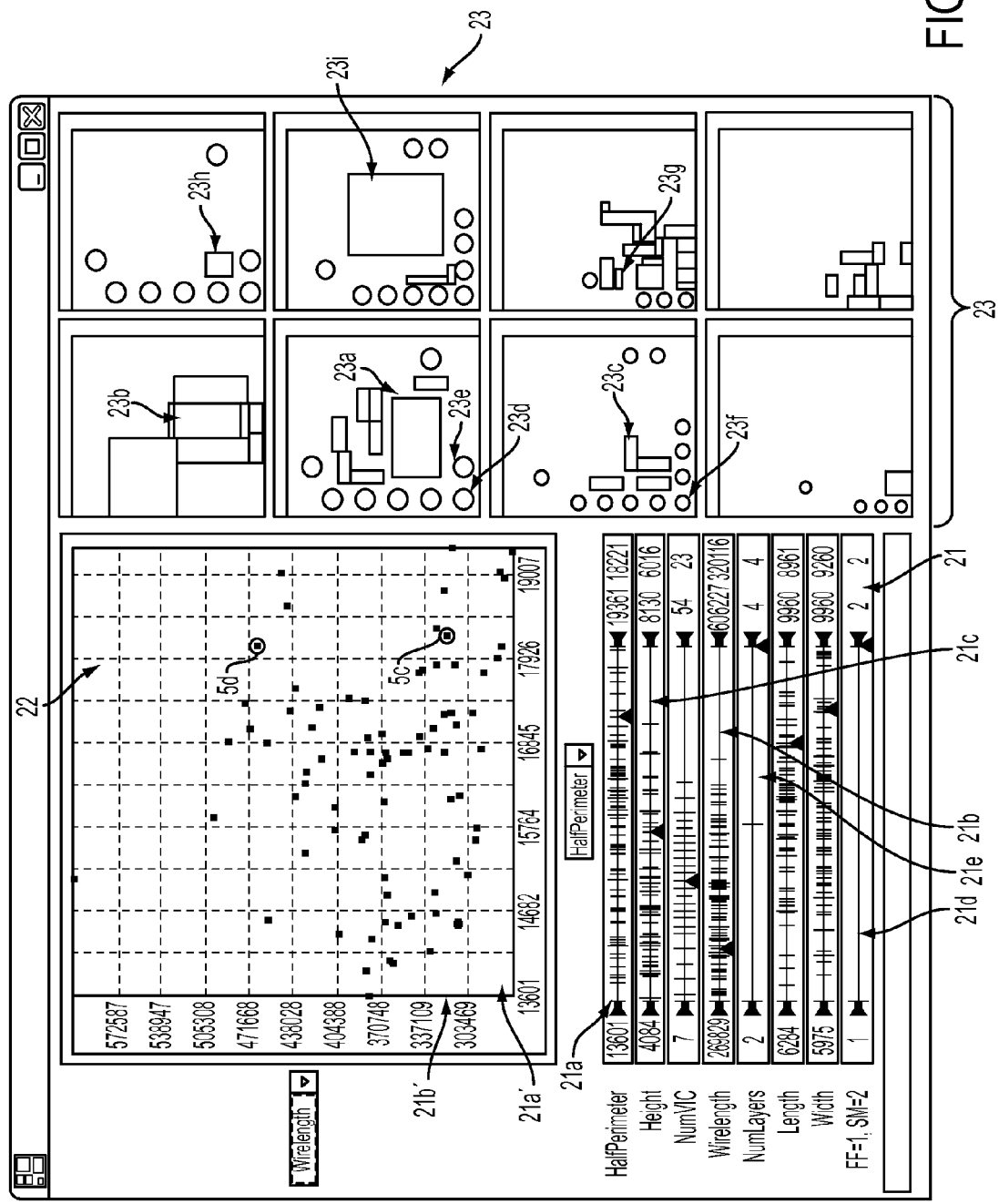

FIG. 7 is an extended FIG. 4 including an additional real design space 23 and including a more detailed illustration of the operating of the destination space 40, more appropriate: of the functions, which are available for operation by the user.

Figure 8:
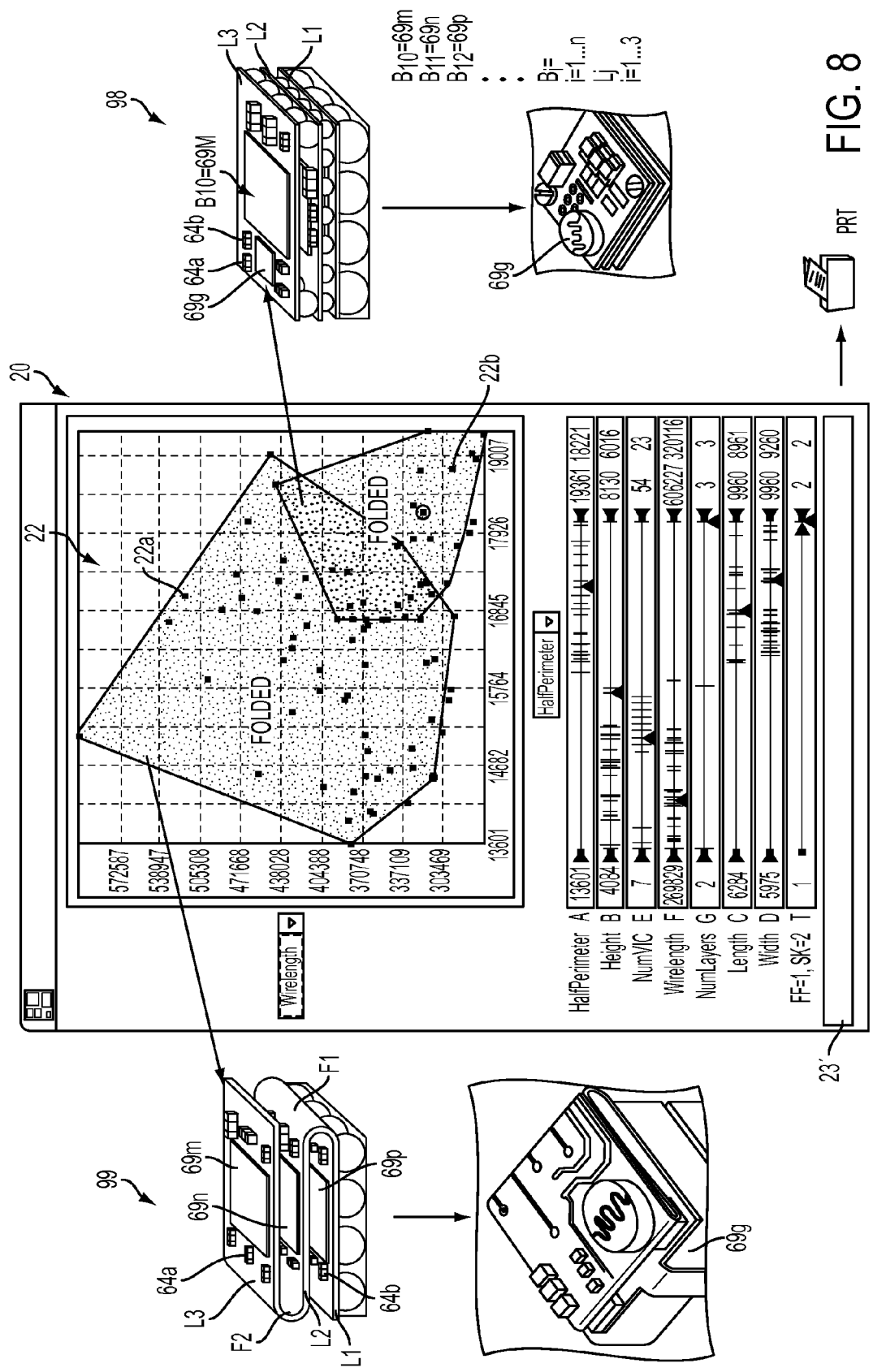

FIG. 8 is another embodiment of FIG. 4 or 7 including the representation of the symbolized layouts and associated therewith a respective type and form of the circuit implementation.

Figure 9:
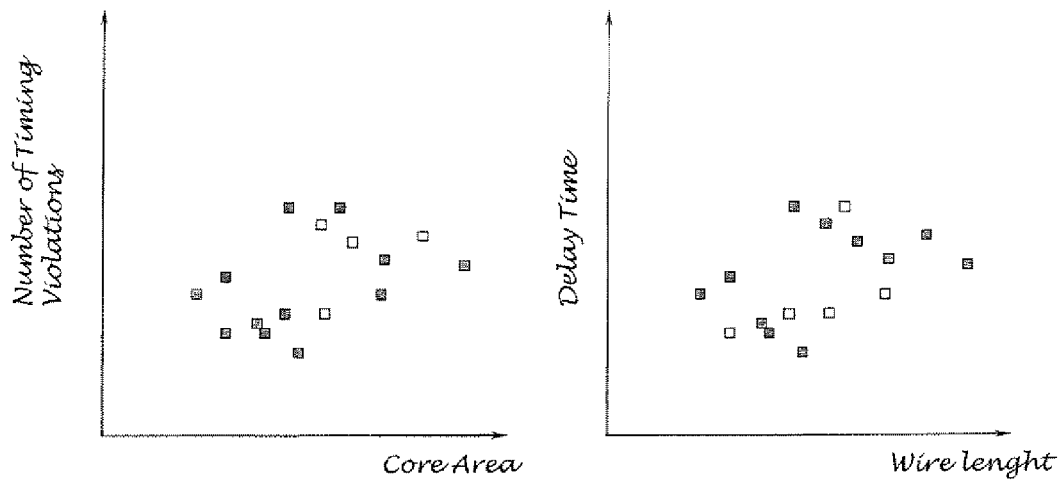

FIG. 9 depicts two examples of further properties, which may be used for constrain management. That is, by comparing design provisions (properties).

Figure 10:
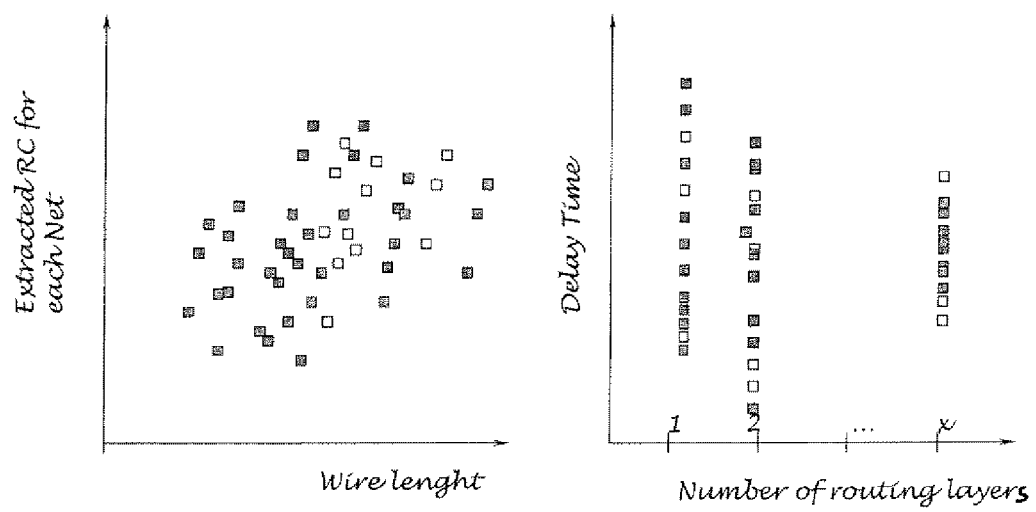

FIG. 10 illustrates further possible properties as further design provisions for said constraint management.

FIG. 14 illustrate four tools or graphic-interactive functions made available, which are ready for being used. They serve to handle the plurality of stored (or: available) solutions towards a best possible selection, which comes about by restriction, navigation, aggregation or extension.

Figure 15A:
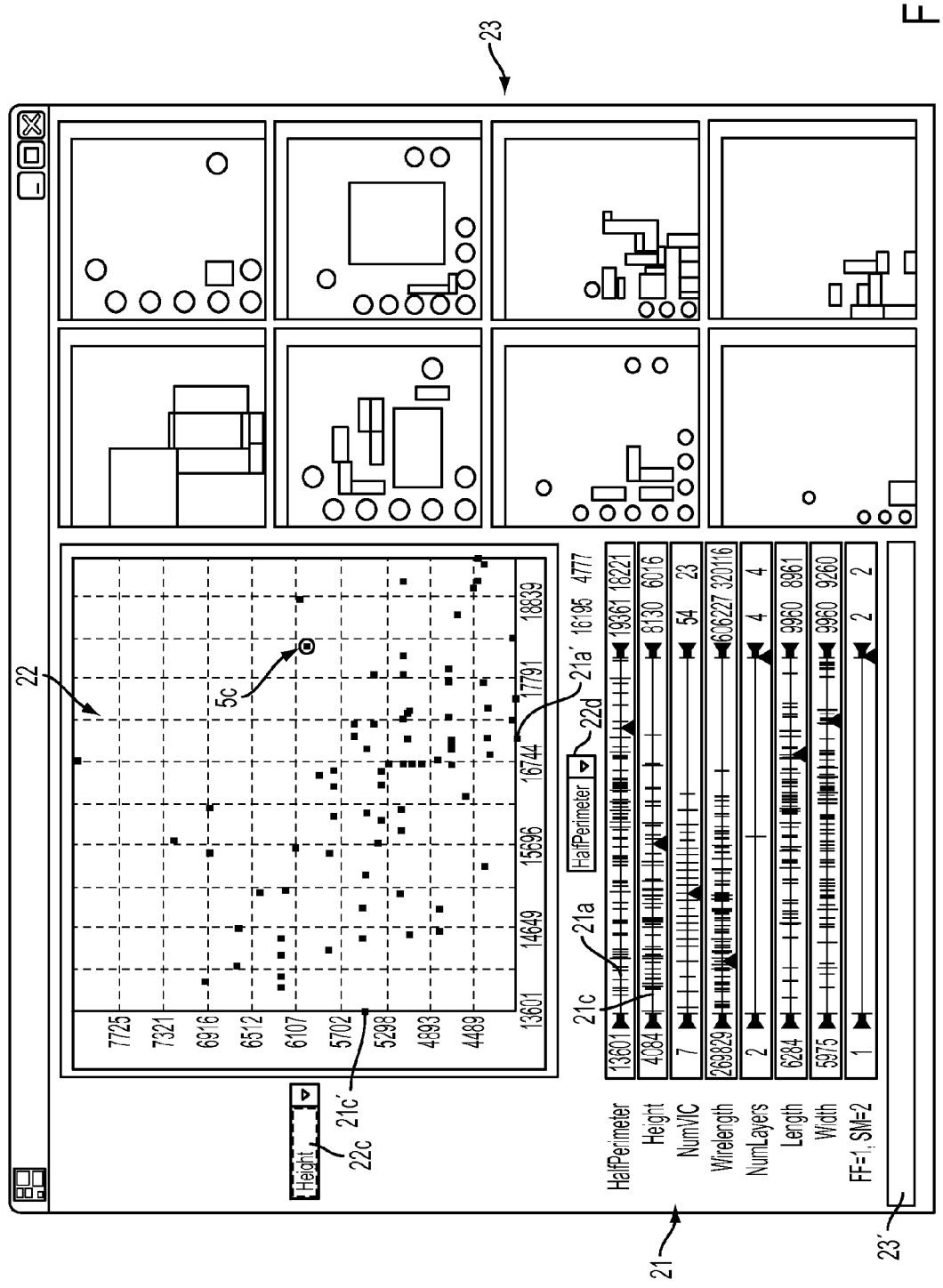
Figure 15B:
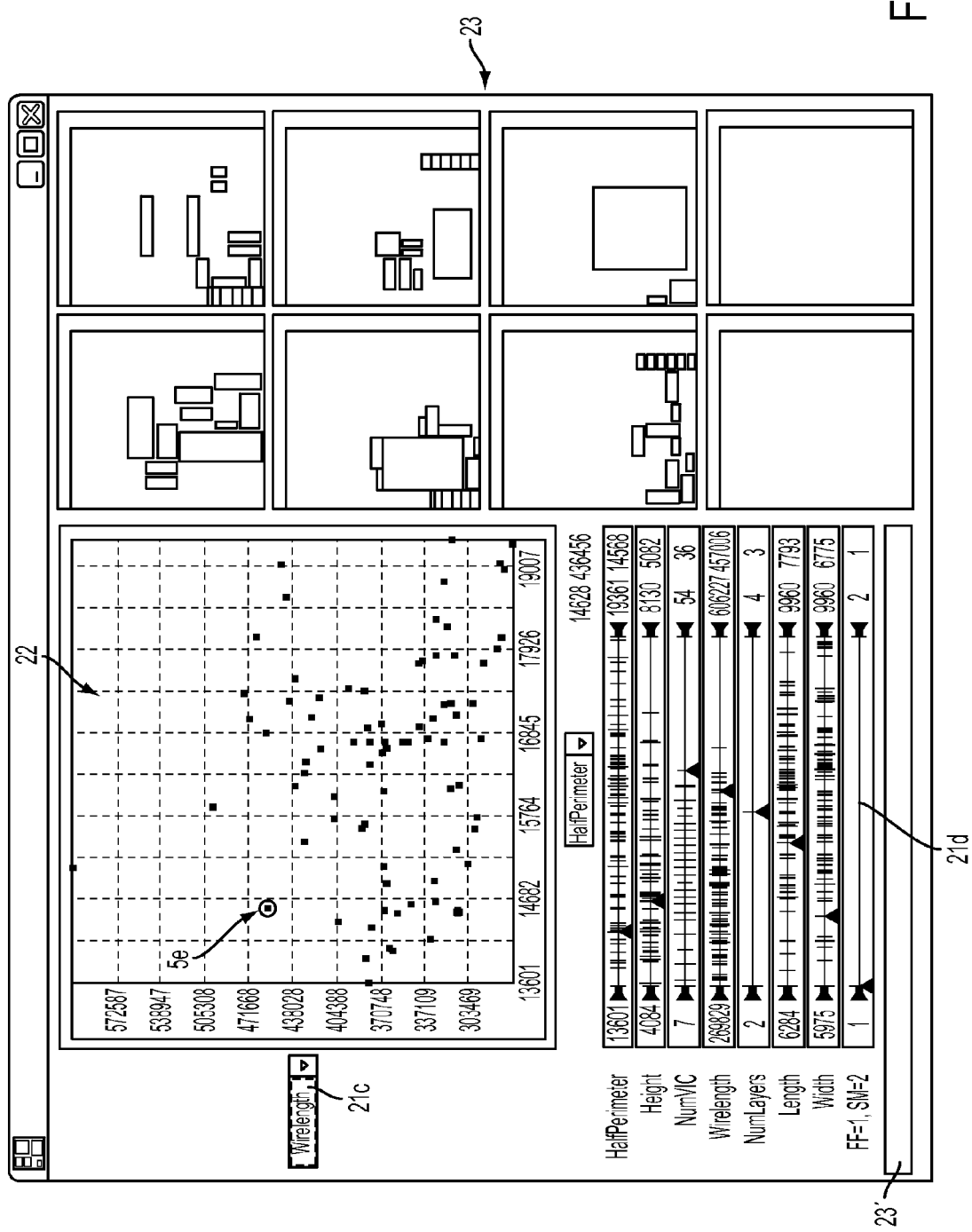
Figure 15C:
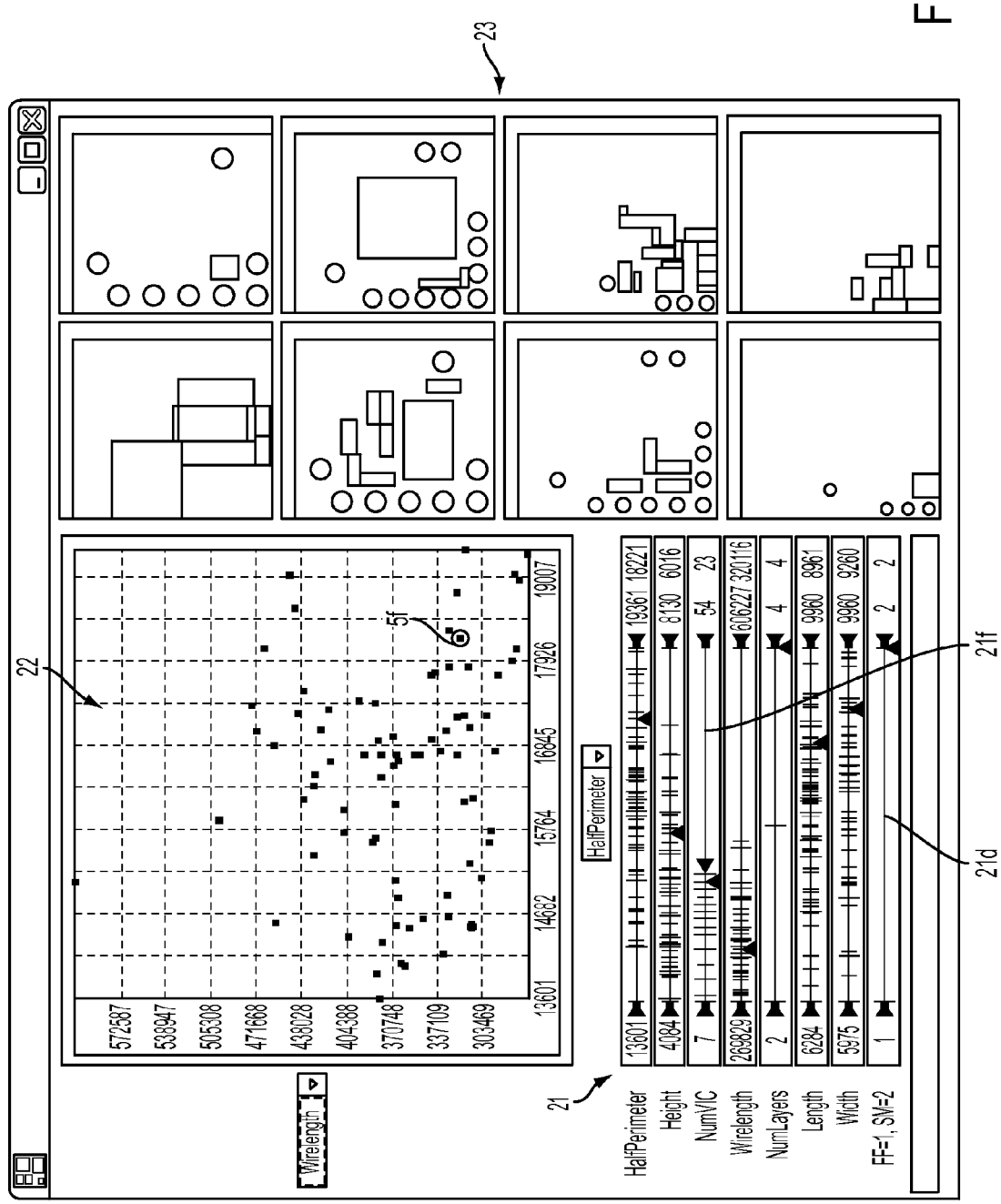
Figure 15D:
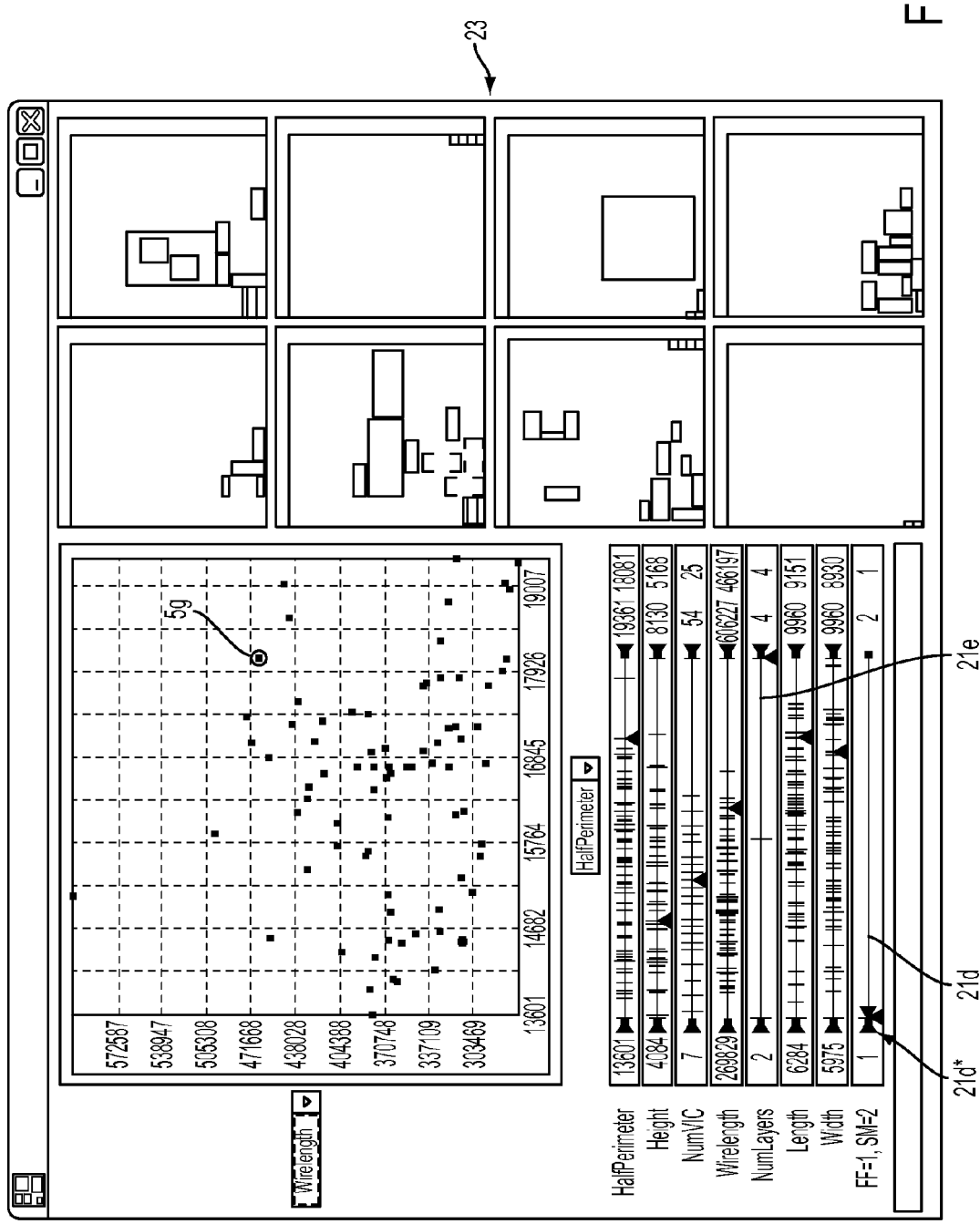
Figure 15E:
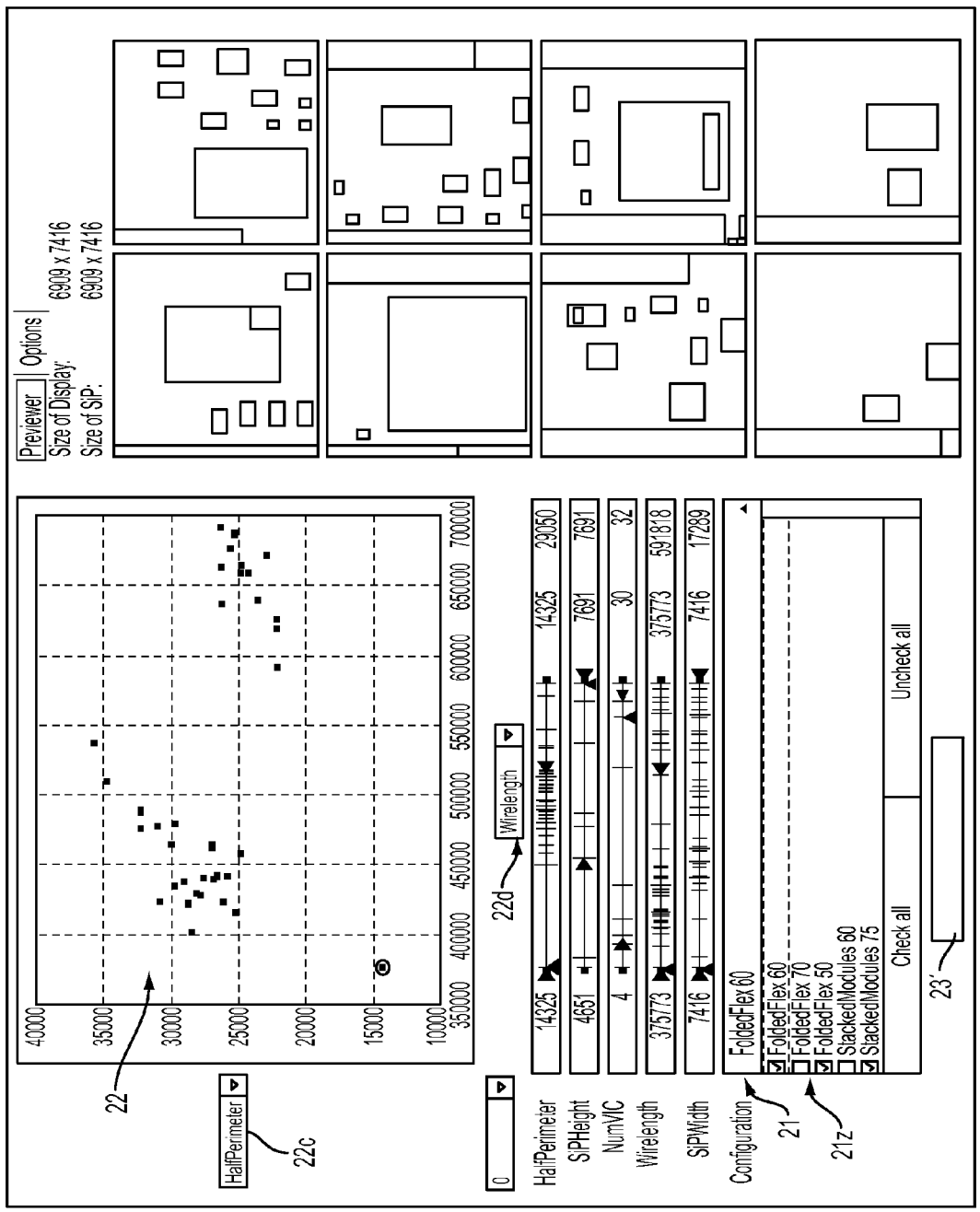

FIG. 15e depict further embodiments of FIG. 7 with different adjustments of the operating elements 21, 22. A respective short explanation is given as to what has been changed relative to FIG. 7. The respective adjustment may be identified at the vertical or horizontal wedge-shaped aligned scale display elements in the operating element 21.

The bock diagram implementation shown in FIG. 1 functionally depicts three sets that cooperate. A high-performance computer system 19 comprises a database 10 that is illustrated in a symbolic manner. The completed solutions stored in the database, which will be referred to in more detail later on, have been calculated in advance in the computer system 19, or they have been calculated elsewhere and are supplied via the interface 5'.

The computer system 19 and associated therewith the database 10 are controlled by means of operation device 30, which is illustrate here as a keyboard. The stored values read out from the database 10, here the said solutions 5, as clarified in a symbolic manner in FIG. 2, are transferred to a display device 20 so as to be imaged in a way that is to be described in more detail. The display device 20 may be composed of a monitor as depicted herein, or may be composed of several physically separated monitors that are, however, operatively connected, or may be composed of other display units. The display devices are to be understood such that there is a visible representation that may be perceived by the user in order to perform selections, comparisons and finally a destination search using the provided solutions. Other types of representations are printers and plotters, a projector and the like. As far as is referred a best possible result of a previously given integration task, the circuit implementation may be forwarded to a real production via a control instruction 31, which is discussed in more detail on the basis of FIG. 6 for the circuit implementation. The specific production steps should not be discussed in more detail herein, these steps can be considered as well-known and the person skilled in the art may use them when having precise provisions about the integration technology to be used, the placing of the components and their wiring.

The focus of a selected type and form of a circuit implementation here is thus its determination, and this may be accomplished in one of the many described integration technologies, which is effected in a real design space 23 that is either represented by the illustrated destination space 40' on the display device 20, or is viewed separated therefrom, however in a functional environment that is also accessible or visible for the user.

Possible physical implementations are thus accessible and hence comparable with reality. They may be symbolic layout proposals or may be configured in other types and forms, which are understandable and convertible for the subsequent production tools.

Examples of the circuit implementations 6, 7, 8 and 9 are explained in FIG. 6.

For a concise representation and in order to quickly select a best possible solution 5 the operating elements 21, 23 shown in FIG. 3 (enlarged in FIG. 3a) and the representation of the real design space 23 are provided. In a coarse overview FIG. 3 shows the way of operation made available, which may be used by a user, however, it should be used for explanation only, but not for being claimed in the claims. This actual use under the influence of the human brain is to be considered completely distinctly with respect to the fact that the solution described herein is to enable such a thinking type of working, i.e., to provide the basis therefor, without intending to claim this human way of working itself. Temporarily also discussing the use hereinafter, is advantageous for simplification and the understanding, however this is not to be understood in such a way that the human brain work is the route cause of the success, rather the provided possibility to present, prepare and keep ready in a controllable manner design proposals for types and forms of circuit implementations is the route cause for the success. The operating element 21 as a first operating device maps all of the solutions 5 to the destination space such that selections and restrictions are doable. Scales are a natural usage for users and technical quantities can be presented in an efficient and clear manner between a minimum and a maximum. Each scale includes at first an image of all the solutions 5, but includes only the respective value of that property that is associated with this solution. Each solution—that is to keep in mind—includes a set of properties which allow to compare the type and form of the circuit implementation with other such types and forms of the circuit implementation. Therefore, only the comparable values are represented in the same scale.

Later on it is explained as to how the represented numbers of values may be reduced in a respective scale.

Frequently, in the following description the term design criterion or in short "criterion" is used instead of the term "properties". These terms are to be considered as synonyms in the context of the description. The term "completed solution" is often referred to as a design proposal or as a set of properties (in the above-identified sense), as this term provides a design proposal that is provided in the database 10 as a pre-calculated completed solution and that is presented in a clear and controllable manner as well as a comparable manner for the user according to FIG. 3.

The first operating element 21 is provided in a linear form or as a 1D element. In the example it includes several scales and allows the limitation as the restriction or selection. It provides the user with the capability to select certain properties, to perform restriction on these certain property scales and thus change integration technologies that hold ready various completed solutions.

The second area is a second operating element 22 as an area-like operating element having a 2D structure. It clearly illustrates the representation of a property relative to another property at first among all of the completed solutions. The illustrated points are the solutions from the destination space, in this case any available solution of the database 10, and with an X-axis scaling and a Y-axis scaling, each of which may be selected from the properties that are represented in the first operating element 21. By means of the representation of the operating element 22 the user is given an assessment of the target criteria that he seeks to improve.

A third operating element is more of a resulting nature, rather than an entering or presetting element. The selected solution that a user wishes to view physically in the real design space is represented by a solution, i.e., by one of the illustrated points in the operating element 22. The solution being represented is an at least two dimensional objective illustration or representation of the type and form of the circuit implementation in the form of several layers, here four layers with views from the top and bottom, wherein the components are illustrated as symbols.

This first overview shall clarify the meaning and the context, which are engrossed in the following.

FIG. 4 illustrates a section of FIG. 3, wherein the design space 40 of the database 10 is visible for the user as a mapped design space 40', and wherein access is provided to the design space 40 via the operating elements 21,22.

In FIG. 4 there are emphasized two solutions 5a and 5b, i.e., circled and provided with an arrow. These solutions represent two solutions of the entire set. Each is associated with a plurality of electric and electronic components which are spatially arranged and electrically connected to each other. These connections and the arrangement are not visible in a physical manner, but are provided symbolically in such a selected solution. The user may change the solution 5a into the solution 5b, he thus has at first the solution 5a represented in a real design space that is not illustrated here, in real by a layout including a layer structure, or he changes to the solution 5b and requests the suggestion of an alternative design for the same integration task for which he seeks solutions in the type and form of the circuit implementation. There will be concurrently made several designs accessible for the user, he may immediately initiate the illustration of the associated real configuration, i.e., the type and form of the circuit implementation by selecting one of the illustrated points.

In the illustrated example is illustrated the conductor length versus the half perimeter (an indication for the area, cf. below). The solution 5b has a greater area, however requires a shorter wire length, which may be deduced from an abstract description of the two points 5a and 5b.

In the operating element 21a plurality of properties are represented, and these properties belong to the set of properties that each solution represents. Among these properties are also the half-perimeter (first row of the scales) and the conductor length (fourth row). A respective vertically oriented wedge illustrates the currently selected solution.

For operation the user may select either one of the solutions from the 2-dimensional operating element 22 (by clicking on one of the presented points), or he may select a solution by selecting a vertical scale line in the field of the linear operating element 21. A linear scale line, for instance at the conductor length, where the vertical bar is visible, immediately provides the further associated properties for this solution that always consists of a set of properties. It is sufficient to select one property (its value) from this set of properties. Associated therewith are the remaining values of the remaining properties, since only one solution is available at a time in a complete state and not in parts.

Solution 5a is thus a complete set or group of properties, whose more abstract description is a wire length that is, e.g., 100 mm greater than that of the solution 5b.

A further advantageous embodiment is discussed with reference to FIG. 5, which is FIG. 4 with a clearer representation of the two explained solutions as well or of the associated types and forms of the circuit implementation.

FIG. 5 shows the two layouts 100a and 100b. They correspond to the solutions 5a and 5b, as depicted in the two-dimensional operating element 22 and highlighted by a circle. The two axes shown in this operating field are the sum of the wiring lengths between the individual components as "wire length" and the half perimeter that is a symbol or a representative of the area, here, the sum of height and width in one plane.

Only one respective layer of the four layers selected by the vertical wedge in the fifth scale from the top of the linear operating element 21 is depicted in the layout representation of FIG. 5. These layers differ from each other substantially in the spatial arrangement of the symbolically represented components and in their electrically conductive connections. For example, the lead contacts may be mentioned in this context, which provide for the connection to the outer periphery. In the solution 5b, i.e., the layout 100b, the I/O positions are provided in a row in a lengthwise manner, while in the solution 5a, i.e., the layout 100a, they are arranged in parallel side by side approximately in the center of the type and form of the circuit implementation of smaller area.

A selection of the vertical axis and of the horizontal axis within the 2-dimensional operating element 22 is possible, symbolized by the drop-down menus. Each drop-down menu can select any property of the linear operating element. In the vertical direction, hence, the height, the number of the vertical connections, wire length, number of layers, length and/or width of the type and form of the circuit implementation, i.e., of a respective associated physical layer may be selected, as well as the type and the form of the integration, and thus the associated technology, wherein FF represents a flexible foil as a circuit substrate and SM represents a surface mounted technology. The symbolic values 1 and 2 represent these technologies and selected is the surface mounted technology, which then also included the solutions 5a and 5b.

In the 2-dimensional operating element 22, i.e., the zone of FIG. 3, where a trade-off is made among the target criteria (in the sense of a compromise), any property may be illustrated against any other property of a set. Hence, many solutions, in the example, more than 10, more than 100 or more than 1000 possibilities of types and forms of is circuit implementations, are illustrated to the user, from which he may select certain properties, and may thus navigate from a first selected solution 5a to a solution 5b, and he may initiate the illustration of these solutions in the real design space 23 or in any other possible representation. A reduction of the wire length is one possibility of change, a change in size may also take place, as well as a reduction of the number of vertical vias or even a direct change between production technologies, i.e., a construction and connection technology (in short: AVT), for the same given integration task, which is determined at higher level from the given circuit, which is determined functionally and by the components as well as by its associated electric connections.

An immediate comparison between types and forms of the circuit implementation is evident.

FIG. 5 could as well allow a change from the surface mounted technology of the one solution 5a to another solution 5c, in which the lower scale is set to one, i.e., a flexible foil is used as a substrate, and the number of the layers may remain the same, as is given by the layer number 4 in the fourth linear operating element of the field 21.

The integration technology that is adjusted via the lower linear scale, or better: is selectable, is again clarified on the basis of FIG. 7. In this case, this scale 21d is the presetting value of the technology used.

If restrictions are not applied on the scales 21, any solution will be displayed in the 2-dimensional operating element 22. All the solutions 5 are also represented on the scales, represented by the vertical scale lines. Each solution has ready a value for each property, i.e., for each of the horizontally stacked parallel scales.

In the upper 2-dimensional operating element 22 certain properties are illustrated relative to each other, and these certain properties are horizontally and vertically selectable. A vertical pointer may represent one of the solutions, which is currently being pointed to in the 2-dimensional operating field by the user, or vice versa. A solution selected below by one of the properties, results, as discussed above, in a highlighting of this solution in the upper 2-dimensional operating element 22.

The possible integration technologies will be discussed in more detail with reference to FIGS. 6a to 6j.

FIGS. 6a, 6b and 6c show implementations 9a,9b with printed circuit board technology as PCB implementations. Active components 69a, 69b and 69c are arranged thereon, as well as in s FIG. 6c as 69d, which in some examples are integrated circuits, which are already packaged and provided with pins. Other components are, for example, conductive through contacts 80,81, so-called vias. The printed circuit board itself is 72 or 71. In the PCB embodiment 9c passive components is 65b are provided as resistors, side by side with the active components, here three IC-circuits 69d and two further ones. In FIG. 6b there are visible other passive components 65a at the left edge, which are resistors. Also passive components are variable resistors 68a to 68c in FIG. 6a or keys 68d,68e,68f in FIG. 6b. In an intermediate area between active and passive there are components such as opto-couplers 70a to 70f or the display 69a, which belong rather to the active components, or such passive components 64a, which can be capacitors. Indicated by 68*a* is a transistor that belongs to the group of active elements, as well as diodes. Passive components are usually resistors, inductors and capacitors.

A further type of circuit implementation is the MCM method of a multi chip module according to FIG. 6*d*. Also in this case active components 69*e* and 69*f*, via 82 and capacitors 64*b* are provided. This type and form of the circuit implementation 8 is a different integration task.

Further different integration tasks are those of the FIGS. 6*e* and 6*f*.

Here are shown SiPs, such as FIG. 6*e* including a folded design, in which a flexible circuit substrate is used, which comprises an illustrated layer L3 as a third layer and a bent section F1. The type and form of the circuit implementation 7*a* also shows a circuit substrate via 83, passive resistors 64*a* and LEDs 65*c*, as well as an active element 69*g* that is provided as a light receiver.

FIG. 6*f* is a stacked configuration of an SiP design. This type and form of the circuit implementation 7*b* includes a via 84*a*, an active circuit 69*h*, a plurality of layers $L_1$ to $L_j$ stacked on top of each other and comprises a further active circuit 69*i* and vias 85 on the base substrate.

A further type and form of the circuit implementation is the integrated circuit according to FIG. 6*g* and according to an extraction thereof as a surface structure in FIG. 6*h*. Also in this case, in a wafer composite in which at first a plurality of circuits is fabricated on the wafer, individual circuits are visible that comprise active and passive components. 69*j* is a processor core, 69*k* represents interfaces and passive "components" 65*d* in the form of bond pads are provided in the type and form of the circuit implementation 6.

FIG. 6*i* illustrates a hybrid circuit including active semiconductors 69*m*, 69*n* and a is capacitor 65*c*. At the bottom row of the circuit substrate there is shown a series of contact elements that represent conductive I/O elements, which may be inserted into jack or which may be provided with soldering tag, so as to electrically connect the hybrid circuit with other circuit substrates or with a main board.

FIG. 6*j* illustrates a chip in embedded technology, in which active elements are embedded in a circuit substrate (as substrate or carrier substrate). The chips are shown as components 69*p*, 69*q* and 69*r*. Additionally are used passive resistors in SMD technology, around the embedded chip 69*r*. Also, an active chip having contact pins for soldering is provided on the circuit substrate. The active chip 69*s* illustrates that different technologies may also be combined with each other, embedded technology, surface mounted devices and soldered Chips in the manner of an installation on a carrier substrate, wherein in present case the carrier substrate 73 is more than a sheer printed board, rather it is a substrate area having a height extension along which said circuits 69*p*, 69*q* and 60*r* are embedded.

All of these and further types and forms of circuit implementation are controllable, selectable and usable to a best possible result by the above-described system. All these types and forms of the circuit implementation are denoted in FIG. 7 as 21*d* with a property, cf. the lower horizontal scale of the linear operating element 21. Although only two different technologies of integration are indicated there, the plurality of technologies described herein and any further not specifically illustrated future technologies of the circuit integration may be used as a property.

One type of the technology for integration is thus at least one property, that is: a development criterion that belongs to the set of properties which describe a solution.

A further property of the set of properties is the line or conductor length that has previously been discussed in FIGS. 4 and 5 as "wire length".

A further property of the set of properties that determine a solution (one of the completed solutions stored in the database 10) is and indication of the size. This package size or installation size may be represented in many ways. Hereinafter it may be simply denoted as "size property". For any such sizes area values may be appropriate, and also volume values. Sizes may also be indirectly described by the number of layers, which, however, are considered here separately.

A package size is at first an area-like or 2-dimensional extension, which may also be represented by the property value of the half-perimeter as the sum and of height and width. Independently, the height of a circuit design may be used as a property of a completed solution as referred to here.

The height does not need to include several layers, but may be describe a layer that is assembled on both sides, that comprises a differently thick circuit substrate, or that uses different components via the type of integration, which have a different installation height. The height is thus a property that may represent the size. Further properties are the length and width of area-like extension, which is separately illustrated as properties in the second and third scales from bottom to top in the linear operating field 21.

Using the volume, several stacked may be combined to a volume. Also, the volume of a package may be added, that is, not only the integration of the components and their connections as such but also the cover or "package".

As an additional property value the number of physically present layers may occur, which is the scale 21*e* in the example of FIG. 7. In this example it is intended to select between two layers and four layers, wherein the vertical wedge selects the four layers that are illustrated as the stacked property values combined by the vertical wedge in the right vertical column. This solution as highlighted in the 2-dimensional operating element by a circle, shall be denoted as solution 5*c*. It comprises four layers, a length and a width of 8961 µm and 9260 µm, respectively, is fabricated by an integration technology in the form of a surface mounted (SM) technology and included 23 vertical vias. Further property or properties of this solution and thus of the individual layers represented in the real design space 23 of the form of the circuit implementation is a physical height of 6,016 mm and a half perimeter on the scale 21*a* of 18,221 mm. All of the size values, the left-hand side minimum size and the right hand side maximum size, illustrated at the left hand side and the right hand side of the scale 21, respectively, are provided—unless specified otherwise—in micrometer. The first column at the right hand side of the linear operating element depicts the selected solution by indicating all of its values associated with the individual properties, as explained above for the solution 5*c*.

Additionally, in the real design space 23 the type and form of the circuit implementation is represented in an abstract manner in the form of a layout. In this real design space there are four layers from top to bottom. The components are illustrated in a symbolic manner on these layers. Active components 23*i*, 23*a*, passive capacitors 23*b*, resistors 23*c*, 23*g* and vias 23*d*, 23*e* and 23*f*, as well as a contact path 23*h* represent the components and their spatial arrangement, their spatial orientation, wherein the spatial arrangement also includes the positioning or better: the placing on a respective one of the four layers. The electric connections are not symbolically illustrated in more detail, but are also included in this proposed solution 5*c* and may be used, upon being selected as a best possible solution, during fabrication of this solution.

A change from the depicted solution 5c to another solution may also be accomplished, as the change between the solutions 5a and 5b. Hereby, the change of one solution takes place in the destination space 40 of FIG. 2 described as the sum of the solutions 5, and these solutions are visible in the visible destination space 40', thus in this case, in the operating elements here 22 and 21, so that the user may act "initiated by view".

The image of the properties used for the 2-dimensional operating element 22 is represented by the line-marked item. The scale 21a becomes axis 21a' and the scale 21b becomes axis 21b'.

If the user changes for example within the 2-dimensional operating element 22 from solution 5c to a solution of increased wire length (Σ of the length of all connections), such as solution 5d, while substantially preserving the area size, he will obtain a different representation in the real design space 23.

Nevertheless, the change does NOT take place in the real design space 23. This space only follows a change of solutions in the destination space 40 or 40', controlled by the operating elements 21,22. All of the solutions are available in the database in a pre-calculated manner. All of the solutions calculated in advance are part of the destination space 40, and the selection of one of these solutions results in a change of representation in the real design space.

The selection of a solution 5d as a new or different solution relative to the currently displayed solution 5c is accomplished by selecting a property, thus, by changing a property, which, however, is not changed in its value but which is selected from the available values. In the new solution 5d a different value was selected. It may also be selected in the linear scale portions, if not being selected in the 2-dimensional operating element 22. The "selection" of a property from a set of "properties" thus does not relate to the selection of a certain value or in a certain operating element but relates more generally to a change of an entire set of properties.

The following should be noted with respect to the pre-calculated solutions. All the pre-calculated solutions are not solutions that are meaningless and thus unusable. The pre-calculated solutions are "discrete pareto-optimal". They are discrete "pareto-optimal" in the sense of the database, meaning, that none of these solutions is better in view of all properties relative to the currently viewed solution. Which one of these "discrete pareto-optimal" set of solutions, however, finally represents the best possible one for the user, is subject to a certain subjective targeting, which solution, as cost efficient as possible, or as small as possible or as short a conductor length as possible, is searched for by the user. A best possible solution is thus such a solution that is subjectively influenced and for this the sum of solutions in the destination space objectively provides a superset of available solutions, which, however, do not all correspond to the user's requirements, which, however, per se, represent good and meaningful solutions, i.e., "discrete pareto-optimal solutions".

The completed solution should, however, not only be understood to be configured in such a way, rather other optimization criteria may also be applied for these solutions, which then represent the set of solutions in the destination space 40, from which via operating activity the "best possible solution" is obtained by the user, or more appropriate "searched for", wherein the search is, however, not arbitrary, but is controlled by operating elements and may be facilitated by functional tools as discussed in the following.

The embodiment of FIG. 7 enables to provide and make available a great and in view of the design goals an extensive set of alternative designs, which may be assessed in a comparing way. From that a "best possible" design is to be selected, which, however, is subject to subjective criteria and is not relevant herein. The practically simultaneous or the fast successive comparison ability for different technologies for the same "given integration task" results to a fast design procedure.

This methodology may be the influencing that relates to the selecting. The selecting and the searching for the result may be sped up.

This may also relate to the improvement that may be seen with respect to a given solution. The improvement is always additionally to be seen in a subjective way, so that it should be referred to more generally as changing, and the method for changing solutions is provided whose subjective appropriateness or qualification, however, is beyond the completed invention. The method can be considered as the designer's tool, design tool or work tool even though it is not a physical tool compared to an instrument. Often such concepts are referred to as tools nowadays, thereby enclosing software capabilities as well as hardware display devices. Consequently, the display representation as such is appropriate to affect the selecting, to change the type and form of the circuit implementation, in particularly to improve it, or generally to provide a selection opportunity providing the user with the possibility to select target-oriented from different possibilities, and not to stochastically "poke around" in a haystack of solutions.

The designer gets at hand a device, a display representation or a method, with which a set of design alternatives (solutions) is provided that offers possibilities with respect to the (designer's) design goals or design criteria. In this multi-criteria approach it is no longer an incident to find an improved design in view of all design criteria (properties of the set), rather the component arrangement and the wiring configuration as well as various characteristics of the type and form of the circuit implementation can be enhanced. From the set of design proposals a solution may be obtained (by the designer) by target oriented restriction and selection at increased efficiency and improved quality, which is as close as possible to the desired design, or which is, with respect to the number of solutions in the destination space, the best possible one. In this way the invention and the previously described embodiments contribute to the solution of a technical problem that results from current design methods, This design method is not restricted to a layer, neither to a layer of a circuit substrate, such as a printed circuit board or any other carrier substrate, which is obtained in the context of an AVT or is be solved therewith, but may also be applied to integrated circuits, cf. FIGS. 6g, 6h, in which are also present different layers or physical levels that are connected by vertical interconnects. A metallization layer or at least one such level is provided between the individual layers, in which electrically conductive lines are routed so as to obtain the electric connections.

The number of layers that is explained with reference to FIG. 7 and FIG. 5 as a property of a set of properties in the solutions, may thus relate, on the one hand, to the number of physical layers of the circuit substrates, or may relate, on the other hand, to the number of connection layers that may be provided in an integrated circuit between respective tow active layers, and that may take on the number two in a one-layer circuit substrate, if the front side and the rear side of this circuit substrate have contact lines formed thereon.

One example of several layers shall be explained with reference to FIG. 8, in which also the generalization of the previously indicated specific properties into general technical properties are explained, as are also specified as possibilities in the table at the end of the description. With reference to FIG. 8 it will further be discussed, what technology areas are and how the generality of the spatial arrangement of the components can be indicated by indexing all components by $B_i$, wherein "i" is an index variable from 1 to n. Likewise, the several layers may be indexed as layers $L_j$, wherein "j" in the example of FIG. 8 ranges from 1 to 3.

Basically, the representation on the display device 20 is the same as is explained above with reference to FIG. 7 (left hand side) and FIGS. 4 and 5. Here, the real design space 23 is not immediately involved, but may be displayed upon request of an active area 23', may be forwarded to a plotter or a printer or may be made visible in any other way. Symbolically, a printer PRT is illustrated that responds to operating the area 23' and that outputs as a physical layout the solution illustrated with its properties as shown in the right hand side of FIG. 7. Examples of such output designs are illustrated at the left hand side and the right hand side of FIG. 8. At left hand side a layout proposal is shown, consisting of a folded flexible circuit substrate that implements a vertical integration in the form of an SiP. At the right hand side there is shown a circuit proposal, which illustrates a stacked solution of an SiP including three physical layers. These two implementations 98 and 99 are to be taken as two technologies, so that they should be denoted as the first technology (FF=1, as folded foil) and as the second technology (SK=2, as stacked layers) in the last scale at the end.

Selected is SK=2, visible with the vertical triangle, and also in the 2-dimensional operating element 22, denoted as a solution, which is located in the technology field 22b, emphasizing the stacked solutions as a sum. This area is spun by the outer-laying solutions and is optically highlighted.

It is important to note that both design proposals 98 and 99 implement the same circuit, thus stem from a same given integration task, which be, for instance, a smart sensor that detects, conditions and forwards via a connection measurement signals. Other possibilities for such circuits with a preset function and having an existing circuit diagram is a module for integration into a motor vehicle.

This "circuit" predefined by the function and the components includes a certain number of components, active components, passive components, wherein not only single components are to be understood as the components, but also complex components that themselves consist of an integrated circuit contacted in top down manner, glued or otherwise attached to the circuit substrate, for example by flip chip technique or by CoB, in which the non-encapsulated semiconductor is glued to the circuit substrate as an integrated circuit and is afterwards electrically contacted with bond processes or micro wires. Often the precise descriptions of the circuit types overlap so that here it will not be distinguished in a too detailed manner, rather it should be assumed that both circuit types 98 and 99 in the circuit implementations represent an SiP in type and form, for one, folded in the technology, and for one stacked in the technology.

The components mentioned above, which may be more generally denoted as components $B_i$, also are indicated more precisely, namely, the same components for the design proposal at the left with the former technology and in the design proposal at the right with the latter technology. An active chip 69m is spatially arranged at the uppermost layer L3 and is also aligned or oriented. There are also shown passive components 64a,64b as surface mounted resistors at left side back corner, as well as a second active component 69q, which is positioned and aligned adjacent to the large first component 69m. Other components are provided in the other lower lying layers L2, L1, which are merely indicated and are not described in detail.

The general notion is thus that the component 69m receives the index 10, 69n the index 11 etc., as shown in the drawing. The layers are denoted as $L_j$. These layers are also in the left implementation with a different technology. In this case the vertical wedge is set to FF=1 in the last scale representation, that is not shown in FIG. 8, but which is readily imaginable. A different masked solution point is then obtained in the 2-dimensional operating element 22, and upon pressing the activation area 23', a representation or an expression of the folded circuit implementation is obtained, which represents a different technology.

This folded representation also comprises three layers, and two bent areas F1 and F2, which connect the first and second layers and the second and third layers, respectively, in order to allow a routing of conductors without requiring to provide vertical interconnects (vias). Also in this case all those components are arranged that have to be provided, spatially arranged and electrically connected to each other in the integration task due to the given circuit. The active component as chip 69m is also in the In uppermost layer L3, as is the passive component 64a, whereas the active component 69q was not assigned to the first layer. The further active components 69n and 69p are illustrated here in the layers L2 and L1 below, as well as the passive component 64b, which has been placed from layer L3 to layer L1. This arrangement is already preset in the solutions, thus it is not specifically calculated, but results from selecting the corresponding solution in the operating element.

For illustration purposes real circuits are also assigned to the respective layout, one circuit corresponding to that of FIG. 6e including an active component 69g and a corresponding stacked circuit including the active component 69g. These two circuit implementations are the actual implementations that are for provided for clarification only. The respective circuits are not produced corresponding to those that arise from the comparison of technologies as layout proposals 98 and 99.

There was adjusted as a property SK=2 in the area 21 so as to highlight the associated technology field 22b in the 2-dimensional operating element 22, wherein the field 22b represents the sum of solutions comprising the stacked circuit substrates. This plane is spanned by the outwardly lying solutions and is optically highlighted.

A second field represents the second technology 22a, which highlights all those solutions that have a folded technology. The tow technology field may overlap, as is shown in FIG. 8.

The respective technology field comprises the outer solutions that are substantially linearly connected in such a way that a surface is obtained that may readily be polygonal so as to allow optical comparisons and to enable to determine targets.

The generalization of the technical properties specifically indicated here is to be discussed in FIG. 8, before these properties may take on other values that may be used in the following for a constraint management.

The properties are denoted as property A to property G as well as property T for the technology. These properties may be extended in any way, if the database 10 is configured accordingly, so that more or further properties are added to a respective set, wherein these properties are not yet shown in FIGS. 4, 5 and 8. They receive respective further operating elements 21, by appending of new scales or by omitting of such scales that are not illustrated or that should not belong to a set. If, for instance, only one layer of a circuit substrate is available and all solutions are in one layer, there is no need to provide this G-scale. All solutions in the destination space 40 are then single-layer technologies, which may, however, deviate from each other in their technologies, so that more than two values may be given for the technology scale T.

If the layers are defined as connection layers, also in the given examples 98 and 99 three connection layers may be provided, which could be an additional property that is not illustrated in this place. It may then be provided even six connections layers, i.e., each layer $L_j$ with two connection layers, or it may generally be assumed that the number of layers is always one half of the number of circuit substrates if all physical layers of circuit substrates are provided with contact pads and conductors on the front side and the rear side. These variants may be used as alternatives.

For the purpose of a constrain management further properties may be added a respective set of properties, wherein—as discussed above—each set is a solution 5a, 5b etc. in the design space 40. For example, in each stored solution there may be included a value for the number of violations of a given timing behavior. Moreover, a further value may be included that represents the number of violations of a given temperature profile. In particular, in the field of integrated circuits extracted RC section are used to allow a statement about the signal delay as well as the resulting damping of the lines. These extractions are provided per net, and in particular in the IC design a large number of nets to be managed may result, for example more than 1000. Especially in this case the layouts are particularly checked in view of timing constraints. If there are too many deviations, i.e., if too many timing constraints are violated, the placing of the core area (the core of the circuit) is discarded and is newly designed. If are considered as properties said constraints may be embedded into the concept previously described.

Each solution included one or more indications about constraints that are also stored in the destination space of the database in a pre-calculated manner. These properties may be compared like the previously denoted properties. The constraints are also technical quantities, they are measurable and they are a representation of a circuit design as a type and form of a circuit representation in order to be compared and assessed. They differ from each other in that there are stronger constraints to be considered and that there are weaker allowably violable constraints. In case of the weaker allowably violable rules one preferably speaks of constraints, and in case of the stronger properties of design rules, however, the definition of these terms blends into each other so that here it should be used a more general language in that they also represent properties of a solution and may be present in at least one and preferably in both operating elements 21, 22.

A timing constraint may then be represented according to FIG. 9 for different core areas with respect to the number of violations of timing provisions, cf. left image of FIG. 9. Also, the delay time may be illustrated in relation to the wiring length that has been discussed earlier as property F.

The constraints per se are not only related to the timing but also to many other properties, as it may be seen from the table at the end of the description or may be obtained from all the combinations as a criterion, i.e., under the title respecting the constraint, wherein the criterion is the described property. Here are given the placing criteria, timing criteria, cross-talk criteria, thermal criteria, supply voltage criteria and such criteria that relate to the overall circuit. There, they are given in relation to respective three technologies, and as being more or less meaningful for the respective technology. However, if the technology is a property, cf. scale 21d in FIG. 7, the values of the constraints of all solutions have to be provided for the purpose of performing comparisons, also for such solutions in which the respective constraint has a reduced meaning, if other technologies are also present in the destination space, in which the same constraint is of greater importance.

Only those solutions can be compared which include pre-stored values for each property.

It is clear that not all of the requirements can be met, if strong and weak constraints are to be met as requirements of the given integration task. The management of the many constraints is called constraint management and is a big challenge in particular in digital high-speed systems and in high-frequency applications. According to the example of FIGS. 9 and 10 the constraints may be presented in the 2-dimensional operating element and illustrated in relation to other properties of the same solution and compared with other solutions. The two axes in the operating element 22 may selectable take on any property scale in the operating element 21 so that ale the number of timing violations may be illustrated depending on the selected technology and may be handled in the sense of a constraint management.

Other examples are the properties of RC extractions of existing nets. This extraction particularly used in the design of integrated circuits maps RC parameters as "lumped elements", which are extracted from a net. In this way an assessment in view of signal delay or resulting damping of the lines is possible.

The number of these extractions may be a property value in the set of properties. It may be is illustrated as a further property, according to FIG. 10, on the left with respect to, e.g., the wiring length. This occurs in the operating element 21, if not only the property F is among the properties but also the property R that represents the number of RC extractions.

This property is usable for a local improvement or simply for an additional assessment of the quality of a design proposal represented in a solution.

FIG. 10 illustrates further properties of the constraint management. Property values may be the delay time and/or the number of routing layers. They may also be illustrated against each other in the operating element 22, not only for one solution of the destination space, but for solutions of the destination space.

The restriction of the plurality of solutions, 10, 100 or more than 1000, is the goal of the user operating the system. He will seek to assess solutions as better or worse based on his knowledge and based on comparisons that are available by the representation system of FIG. 7 or 8. In other words, it may be referred to a restriction, when starting form more than 1000 possible solutions, any of which could be implemented in one or the other technology, of which, however, only few correspond to the user's subjective goal and perhaps only one represents the best possible solution. Abstractly spoken, this is a fast as possible restriction of the available set of pre-calculated solutions (the completed solutions), and a determination of a single solution that is to be produced as a design proposal.

This restriction and the selection of this solution is faster via provided function and via an optical interaction and may guide the user more target-oriented, as is the case when he would search by accident in the destination space with his operating elements 21 and 22 without these tools x.

These interactive functions are to be discussed on the basis of FIGS. 11 to 14. They are denoted as graphic-interactive functions for the control of the representation of the stored solutions. Certain solutions are then either removed or illustrated in a weaker manner with respect to the remaining solutions that are with the requirements.

This is shown in FIG. 7. In the operating element 21 solutions are illustrated with vertical scale lines that are richer in contrast and with such scale lines that have reduced contrast.

Those having a stronger contrast are selected in the context of a restriction. The restriction may also be accomplished by presetting ranges on the scales, wherein also different scales in the operating element 21 may be provided with such upper and lower limits. Each scale already has a minimal and a maximal value, so that the limits should be between these two values to make sense. Then a selection of other property values is also achieved by selecting a certain range of property values. Only those solutions are illustrated with stronger contrast or in a different color in one or both operating elements 21, 22, that have a value within the restricted property scale, which is within the restricted range. In one example, the technology is to be considered as being restricted. Only such technologies were selected that had the representation value 2 on the lower scale 21d, i.e., surface mounted devices. This is illustrated by indenting the two horizontal wedges to the number 2. The solutions resulting therefrom include the number 2 in the property "technology". The other solutions were illustrated with less contrast and were illustrated in the operating element 22 not as pronounced and were illustrated with less contrast in the operating element 21.

The restriction to less depicted solutions may manifest, with respect to more available solutions, in that the illustration is either less in contrast or takes place in a different color. Also, a total masking of the non-selected solutions in favor of the selected solutions is possible.

This graphic-interactive function is used to restrict the available stored solutions to only few illustrated solutions, as solutions illustrated in a less pronounced manner. The selected solutions are illustrated more pronounced, the non-selected solutions are illustrated more weakly, with less contrast or not at all. The representation relates either to the operating element 22 or the operating element 21 or both.

Further functions of the graphic-interactive restriction of the represented set of solutions will be explained in the following.

Figure 11:
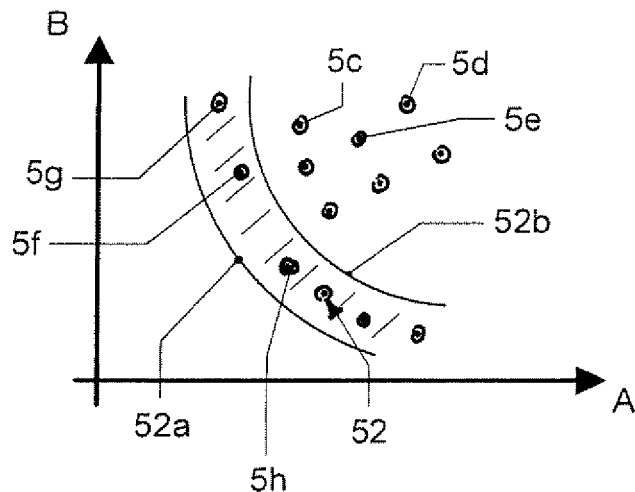

In the operating element 22, the 2-dimensional operating element, which may be configured as an X-Y-system, or as a type of a polar coordinate representation, a first property value may be restricted with respect to a second property value in a continuous part. FIG. 11 shows this part 52 that represent a continuous field of two hyperbolas, which extend in parallel and offset from each other. Several solutions 5f, 5g, 5a are within the field 52, which solutions arise from the total set of stored completed solutions. They are above the lower borderline 52a and below the upper border line 52b. Each of them includes the properties B and A, and therewith the solutions 5f, 5g and 5h are selected and the other solutions 5e, 5c and 5d are either no longer illustrated or illustrated with reduced contrast or illustrated in a different color, e.g., grey instead of black.

The functions 52a and 52b may be preset. They should not intersect and by using them that part may be determined that is of greater, further interest. The benefit becomes clear when the properties A and B are replaced by selecting different property values and the selected solutions 5f, 5g and 5h are again highlighted in the 2-dimensional diagram relative to the non-selected solutions, although a restriction selection did not take place with respect to the solutions displayed later. Thus, the selection from the part of the properties A/B has also influence on other properties, and here again two functions may be provided that again prefer some solutions, in the context of a second selection.

All selections result in restrictions. They restrict the set solutions that is illustrated more pronounced or illustrated at all. In a concrete example for the properties A and B it may be referred to the area consumption, thus e.g., the half perimeter, and the wiring length. Their restriction to such solutions that predict best possible compromises is shown in FIG. 11.

The border lines 52a and 52b do neither need to be linear nor perpendicular and horizontal, but they may extend in any way that is either pre-selected or is selectable from available functional curves. If such progression is selected, also the part 52 is determined. For horizontal straight lines that are separated and do not intersect this corresponds to two limits and the scale of the property B. Two separated vertical parallels correspond to two limits on the property scale A. Thus, restrictions may also be effected in the scales by moving to the interior the wedge symbols pointing to the left and the right on the scale. A substantially more elaborate and sophisticated restriction is provided by the 2-dimensional restriction according to FIG. 11, which not only allow straight lines but also other functions.

Figure 12:
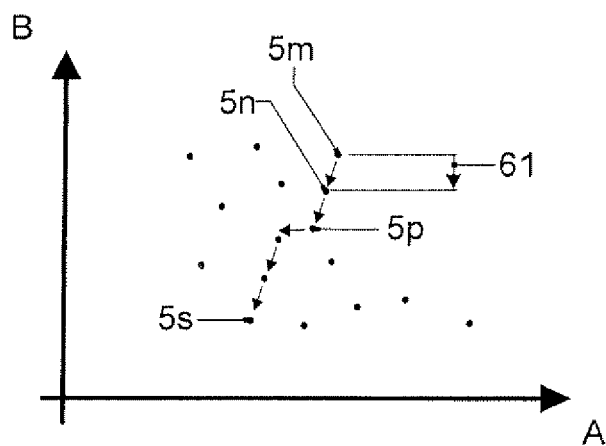

In FIG. 12 there is a further graphic-interactive function. It is called path presetting.

The path presetting is a function in which an origin is set, here the solution 5m. In the 2-dimensional representation of property B, plotted against property A, a way (path) is looked for that leads to the next solution, i.e., in the example 5n. The associated step or path section is 61. This section is calculated by the central computer 19 such that both properties, the property A and the property B, are enhanced. This enhancement of each of the two properties is, however, achieved by considering a change as steady as possible. A next solution as close as possible is thus determined by calculation (distance 61), which avoids a stepwise change in the sense of a significant change of each of the two properties A and B with respect to the values of the solution 5m.

This steady obtained path may then be continued by the next solution 5n with a further step to the solution 5p. Further path sections are illustrated up to solution 5s in a symbolic manner. The path extends through a plurality of illustrated solutions from the destination space, of which, however, none is pre-selected in FIG. 12.

Also, the combination of the FIGS. 11 and 12 may be used. The path presetting of FIG. 12 can only be applied to solutions, which previously experienced a restriction according to FIG. 11. In the other direction several path presetting may be used, each with a final solution that thus represents a superior set of solutions that is then subject to a restriction according to FIG. 11.

Per se also the FIG. 12 is a restriction if applied several times by using the interaction technique in order to find several—but few—solutions similar to 5s. If FIG. 12 is applied once and alone, however, it is a determination of one and only one solution along a preset path between (or: through) all solutions of the destination space 40, here illustrated in the 2-dimensional operating element 22.

Additionally it is to be noted that the multiple path presetting may also be applied for different properties. If a path presetting is completed the properties B or A or both may be replaced, and further path trials may be performed.

The determination by calculation for avoiding a step change is accomplished in the following manner.

The activation of the function triggers a search for solutions in the database 10, which are "similar" or "close" to the solution in view of the two properties. This search request to the memory requires the provision or definition of a similarity metric (a metric) in the set of solutions.

A plurality of similarity metrics is known from mathematics or from experiment planning. The selection or definition of an appropriate metric depends on the respective requirements or knowledge of the user. In the search for the solution 5n that approximates the presetting the restrictions may be taken into consideration or may be ignored.

The number x of "answers" to the search request, i.e., the x solutions selected in the database having the y (less/equal to x) smallest distances to the origin, is selectable. A solution is searched for, for instance by linear optimization, that is closest in the sense of the maximum norm and whose distance 61 with respect to 5m is smallest. From this, even several results may be obtained. The results may be highlighted by contrast in the area 22, they may concurrently be sorted in their order in a table and may be highlighted therein (not shown, but readily imaginable).

An alternative is to select a relative weighting with positive numbers k1, k2 of the two properties illustrated in the XY-plane as operating element 22. In this case, starting from the current solution 5m, i.e., the point the XY plane associated therewith, a rectangle is "inflated", whose side ratio corresponds to the selected weight ratiok1/k2 and whose upper right corner lies in the current point 5m. The inflating stops, when for the first time one of the points—representing the other solutions—is covered or reached by the rectangle. The solution represented by this point 5n is the next solution on the path presetting with the first step 61.

The step avoidance is a description of the avoidance of significant changes, for instance not more than 10%. Naturally, a change of both properties has always a stepped function, however, the next solution 5n, starting from the solution 5m, is "as close as possible" and as similar as possible to the latter, so that avoided steps are meant to be such steps that are significant changes beyond properties that are as similar as possible.

The compilation of properties is denoted as aggregation. A further property is thus added to the set of properties (the completed solution), that combines several but comparable properties. This is illustrated in FIG. 13 for an example for a property A.

Other than the 2 dimensional graphic-interactive functions of FIGS. 11 and 12, this graphic-interactive function takes place in the operating element 21. Several property values A1, A2, A3 and possible further one are combined to a property value A. This is accomplished by averaging or generating a maximum of the values A1, A2 and A3, and others, if provided. They only have to be comparable so as to enable the combination thereof. One example from the set of criteria from the end of the description here is the offset of a component from the edge, among the "placing requirements for the circuit components". If the offset of three components is given as three individual properties, they may be aggregated and may be treated under the property "distance of components from the edge".

Other properties B and C may be the different signal propagation speeds of conductor section or different impedances of nets in integrated circuits. They may be aggregated for simplifying and facilitating the overview, however, at the extent of being comparable to each other. The aggregated property is treated similarly as any other property of the set. It may, however, be further divided in the representation of the scales, as is shown in FIG. 13, so that within the set also the individual sub-properties may be changed as A1, A2 or A3, so that as a result thereof also the main property A changes, which in turn may itself be changed, and thus all sub-properties may change.

The previously described graphic-interactive functions in the area of the FIGS. 11 and 12 may as well be applied to the combined property A that is also present in any of the other solutions so as to available for comparison. It is to be reminded in this context that all solutions are related to the same given integration task and all solutions represent types and forms of the circuit implementation, which stem from the same given integration task of said "circuit".

The graphic-interactive function shown in FIG. 13 aggregates a plurality of comparable sub-properties to a combined property. The same holds true in the reverse direction, a global property may be localized into a smaller area. Such a graphic-interactive function shall be denoted as localization.

The localization is actually not a restriction but rather an extension, however, a locally restricted extension.

In the example, the localization according to FIG. 14 allows to control the wiring length restricted to a region of the solution or of the design proposal represented thereby. In this way in addition to the property "wiring length" in FIGS. 7 and 8 a local property is created, which has due to its name a locally restricted meaning only, but is deduced from a property that has global meaning for the given integration task and the solution, respectively. This local property may then also be extended to all solutions in the destination space 40, for each individually. Also in this case care should be taken that comparability is given. The locally restricted meaning of said sub-properties is also available in any of the solutions.

In FIG. 14 the localized area is 20% of the area, by way of example. It may be enlarged or reduced by the double arrow in the upper right corner. The region thus selected is calculated with respect to its wiring length and is entered into the set as a further property.

Advantageously, the determined region my be preset in the real design space 32, as FIG. 14 itself also illustrates a layout proposal that comprises active and passive components and vias on a substrate carrier. The illustrated sub-region may be preset in a graphic-interactive manner and, for instance, the wiring length may be determined therefor, which then represents a further property of the set, in addition to the global wiring length that varies between 269.8 mm and 606.2 mm in the solutions in FIG. 7.

The local view is not restricted to the wiring length, as is already evident from the so called example. Other examples are the heat generation which may also be considered in a locally restricted manner.

It appears that all types of graphic-interactive functions may interact with all areas of the visible logic spaces. The graphic-interactive function may interact with the 2-dimensional operating element. It may interact with the scale operating element 21. It may also interact with the real design space 23.

Any combination of these three individual functions is also possible and contemplated herein.

Contrary to FIG. 7 respective properties illustrated in FIG. 15 are changed in operating element 22 or restricted differently in operating element 21.

In FIG. 15a this relates to the selection of the property "Height" on the Y-axis in operating element 22. In FIG. 15b this relates to the selection of another solution (another point), among others a different technology in the operating element 22. In FIG. 15c this relates to a restriction according to FIG. 11 in the property "NumVIC", corresponding to the number of vertical interconnects (VIC). In FIG. 15d this relates to the restriction according to FIG. 11 for the property of the technology on "FF"=FoldedFlex (flexible foil), In FIG. 15a there is shown the display representation of FIG. 7 that shows the same real representation 23 of a layout of circuit in several layers. A change is the property of the Y-axis by the axis 21c', which is the representation of the selected axis 21c from the 1D-operating field 21. In the X-axis there is still illustrated in the operating element 22 the value half perimeter representative for the area of the scale 21a, herewith the X-axis 21a'. The selected solution 5c is the same as in FIG. 7, except for the different is scaling and numbering of the vertical direction, however a comparison of the vertical wedges in the linear operating element shows that the same solution is selected, merely in the drop-down menu 22c it is switched to a different property (or: selection), namely, one of the properties that are available in the 1D operating element at the bottom thereof. The same may be applied to the horizontal X-axis, here with the drop-down menu 22d. The solution 5c is illustrated either by operating the acknowledge field 23' or directly in the real design space 23.

In FIG. 15b in the lower 1D scale 21d a different technology is selected. This can be seen from the vertical triangle shifted to the left so that also any other vertical triangles have been shifted as the properties associated with this solution 5e. For the number of layers evidently the layer number 3 is selected, so that in the real design space also three layers having a front side and a rear side are illustrated, the fourth layer is empty. The selected solution 5e deviates from the representation of FIG. 7 having the same axes X-Y, as readily noticeable in that all points illustrated in the 2-dimensional operating element 22 are the same as those in FIG. 7, as is required due to the same denotation of the axes (and the same destination space 40).

An example of a restriction is shown on the 1D scale 21f in FIG. 15c, wherein the two horizontally pointing wedges represent the maximum and minimum value for the number of vertical interconnects. Only those points that fulfill this requirement or that are within this area on the scale 21f, are illustrated dark and with increased contrast in the 2-dimensional operating element 22, contrary to those solutions that do not meet this requirement. These solutions are brighter (grey) in the operating element 22. The lower number of vertical interconnects is 7, the upper limit given by restriction is about 25. The associated selected solution is 5f, which is thus illustrated in the real design space 23, here with four layers.

FIG. 15d is another type of restriction according to FIG. 11, here with respect to the 1D operating element—21d that represents the technology. The selection was done by positioning the two horizontal wedges at the number one of the technology FF (flexible foldable circuit substrate). Any other technologies, here thus those having the number 2, are illustrated in grey in the 2-dimensional operating field 22, i.e., with less contrast. One of the solutions 5d illustrated in black, with more contrast, which differs from that of FIG. 15b, which, however, is visible there at a conductor length of about 471,668 μm in the third small box from the right in the operating element 22. In the real design space 23 this solution 5g results in a layout differently configured relative to FIG. 15b, including totally differently placed components and thus also totally differently routed conductors and connections.

They are not shown in the real design space 23 for the sake of clarity, but they may be made visible upon operating an activating or operating field that is also not shown.

The restriction at 21d* on the scale 21d is to emphasized, and the restriction of the number of layers to four layers according to scale 21e, with respect to only three layers illustrated in FIG. 15b.

In FIG. 15e it should be illustrated with a further example for an SiP the possibility to pre-select certain properties. Several properties may be stored in each completed solution and from these properties only few properties are actually displayed. These displayed properties are enabled for illustration by a check mark in the check boxes 21z so that they may be selected on the technology scale 21d.

The remaining non-selected properties remain in the set of properties in the completed solutions within the database, but are not plotted or displayed in the scales for use for selection. In other words, there are stored more properties in the set of a solution, as are concurrently illustrated in a view affecting manner. Blocked properties in one solution thus relate all the solutions in each set with respect to same property. Non-blocked properties are enabled for being displayed and determine the scale numbering in at least one of the operating elements.

The representation for the operating element 21 may be appropriately applied to the adjustment fields or switching fields 22c, 22d in the 2-dimensional operating element 22, as shown in FIG. 15a. The drop-Down menu thereof may also be configured as the one that is illustrated in FIG. 15e, except for containing the properties of the 10 scales in the operating element. Technology is only one property therein.

n.b.
  A significant sign for the use of the above proposals is given, for example, when within one section of the e CAD design chain of an electronic system several design alternatives are provided (visibly), written, printed, plotted, illustrated on a display (one or more screens), projected with a projector on a screen, or provided by further similar "representations".
  As an example, a multiple result of an auto router may be referred to, in which several criteria (properties of the set) are varied, e.g., the number of layers versus the structure width.
Corollary.
  Possible design or target criteria (properties of the set of a solution) and constraints (other properties of each set of each solution) for other AVT or integrated circuits, cf., next page[1].
    [1]Annotation: Meant is page 49 ff (English version), as the following paragraph is in the German PCT publication on the same page as this one.

The illustrated working modes may be applied to practically all parts of the design of physical circuit implementations. The design tool is available for the user, allows him to perform the multi-criteria approach, does, however, not require, in the sense of the patent claim (cf., claim 1 or 40), a human brain work for the completed invention (the invention as such does not need this expertise).

The following design and target criteria as well as constraints, individually or in any combination, may be possible in a specific application. The importance, or let's say, the probability that one of said properties is part of the set of properties is—depending on the integration technology of the electronic system—is described as below
++ essential.
+ important.
0 not relevant.

| | Applicable to design of | | |
|---|---|---|---|
| | Printed boards PCB | Compact modules SiP | Integrated circuits SoC |
| Criterion | | | |
| Implementation technology | ++ (Substrate technology: Laminate, ceramics, thin film, connection technology: soldering, gluing) | ++ (Interconnect technology: Flip chip, wire bonding, TAB; integration technology for SiP: stacked, folded) | ++ (Semicondutor technology CMOS, BCDMOS etc.) |
| Production effort and costs | ++ | ++ | ++ |
| Area consumption | ++ | + | ++ |
| Volume | + | ++ | 0 |
| Wiring length | ++ | ++ | ++ |
| Number of vertical interconnects | 0 | ++ | 0 |
| Number of wiring layers (substrate, circuit substrate) | ++ | + | + |
| Conductor density and capacitance | + | ++ | ++ |
| Number of vias in the wiring | ++ | + | ++ |
| Grid dimension for placing | 0 | + | ++ |
| Number of modules | 0 | ++ | 0 |
| Number of partitioned chips in dividing a system in several ICs | 0 | 0 | + |
| Number of IOs | 0 | 0 | ++ |
| Signal propagation and delay times | ++ | ++ | ++ |
| Signal integrity or distortion | ++ | ++ | ++ |
| Power consumption | ++ | + | ++ |
| Which is e.g. different for different wiring variants. | | | |
| Thermal development | ++ | ++ | ++ |
| Predicted reliability | ++ | ++ | ++ |
| Respecting the constraint as a criterion | | | |
| Placing requirements for circuit components | | | |
| At the edge | + | + | ++ |
| top/bottom | + | ++ | 0 |
| accessible from external | + | ++ | 0 |
| far as possible | ++ | ++ | ++ |
| close as possible | | | |
| components of a functional group combined if possible | ++ | ++ | ++ |
| Timing constraints und violations. | | | |
| Propagation time | ++ | ++ | ++ |
| Delay time | ++ | ++ | ++ |
| Homogeniety of clock tree (concurrent arrival of clock signal) | + | + | ++ |
| net- and signal-constraints | | | |
| Deviation from the preset length | ++ | + | ++ |
| Impedance of the line | ++ | ++ | ++ |
| Number of the discontinuities (vias, vertical interconnects etc.) per net | ++ | ++ | ++ |
| Reflection and distortions | ++ | ++ | ++ |
| Parasitic load (RC, Parasitics) | ++ | + | ++ |
| Number and strength of cross talks for the lines and components | ++ | + | ++ |
| Number of stages to be driven (Fan Out) | + | + | ++ |
| Thermal constraints | | | |
| Deviation from the preset operating temperature | ++ | ++ | + |
| Number of hot spots | ++ | ++ | ++ |
| Adjacent heat intensive and temperature critical and thermo-sensitive components | ++ | + | 0 |

-continued

|  | Applicable to design of | | |
|---|---|---|---|
|  | Printed boards PCB | Compact modules SiP | Integrated circuits SoC |
| Supply | | | |
| Noise fraction in supply grid | ++ | + | + |
| Separation of various supply grids | ++ | ++ | ++ |
| Potential equalization in supply grids | ++ | ++ | ++ |
| Insuring a sufficient supply voltage level | ++ | + | ++ |
| Homogeneous distribution of the supply lines in the design | ++ | ++ | + |
| Overall circuit | | | |
| Emission and radiation in the sense of EMC (Electro magnetic compatibility) | ++ | + | 0 |
| Allowable environmental data (toxicity of materials etc.) | ++ | + | 0 |

++ essential.
+ important.
0 not relevant.

The invention claimed is:

1. A method of at least contributing to a selection of a type and form of a circuit implementation in at least one layer for a given integration task in one of:
 an integrated circuit or many thereof combined in a wafer composite;
 a module on an area-like carrier substrate; and
 a compact module; the method comprising the steps of:
  (1) a plurality of electric or electronic components are to be spatially placed and electrically connected with each other;
  (2) a plurality of completed solutions for the given integration task is stored in a database, and each of the completed solutions comprises a set of properties, and each set includes at least the following properties for the given integration task:
   a technology of integration;
   a package or installation size;
   a number of physical layers for conductive paths or conductors in a vertical direction; and
   a wire or conductor path length;
  (3) using said completed solutions stored in the data base to define a destination space, and selecting a solution therefrom by at least two operating elements in a display device wherein all solutions of the destination space are concurrently displayed by the display device, with at least some properties in the first of said two operating elements and at least with respect to two properties in the second of said two operating elements, and wherein a graphic-interactive function controls the representation of the completed solution in the destination space to restrict available completed solutions to only few represented and highlighted completed solutions;
  (4) said selected solution determines type and form of the circuit implementation as a result of the given integration task, and aggregates said plurality of electric and electronic components in one of a plurality of integration technologies;
 wherein in a second portion of the display device as the second operating element at least two properties from the set of properties are represented versus each other, thereby allowing a comparison in the second portion of two property values of all completed solutions stored in the database.

2. The method of claim 1, wherein said selected solution is represented in a real design space, whereby a real representation of an actual spatial arrangement of the components and electric connections thereof are illustrated on the display device.

3. The method of claim 2, wherein each physical layer is represented separately.

4. The method of claim 2, wherein at least a single section of the type and form of the circuit implementation is represented on the display device.

5. The method of claim 1 or 2, wherein a set of control instructions for production tools is outputted for a solution represented in said real design space.

6. The method of claim 2, wherein in a third portion of the display device no more than one physical image is represented as a design of an electric or electronic system in said real design space.

7. The method of claim 2, comprising three portions which are non-overlappingly represented on the display device.

8. The method of claim 1, wherein a different one of said plurality of completed solutions is selectively represented in a real design space on the display instead of the previously represented solution.

9. The method of claim 1, wherein the integration is finally effected with only one integration technology as used integration technology, but wherein several different integration technologies are included in the pre-stored completed solutions.

10. The method of claim 1, wherein in the integration task carrier substrate as integration of discrete components on a 2-dimensional circuit substrate, a substrate technology is applied including laminate, ceramic or thin film.

11. The method of claim 1, wherein for the integration task compact module, an interconnect technology including flip-chip, wire bonding or TAB is applied including one of the following vertical duplicates stacking folded with a flexible conductor substrate.

12. The method of claim 11, wherein the compact module is a micro circuit (CoB).

13. The method of claim 1, wherein for the integration task integrated circuit, a semiconductor technology is applied.

14. The method of claim 1, wherein for the integration task compact module or integrated circuit an integration technology of embedding is applied including
   a hybrid technology or a thick film technology, including an integration of passive and active components in the substrate or as integrating part of a two-dimensional substrate.

15. The method of claim 14, wherein connection lines are visible in the real design space between the represented components.

16. The method of claim 14, wherein contacts for contacting the circuit implementation from outside are visible in the real design space in a third portion of the display device.

17. The method of claim 1, including at least two layers as physical layers.

18. The method of claim 17, including at least three of four or more layers as physical layers.

19. The method of claim 17, including at least two physical layers as conductive connection layers.

20. The method of claim 19, including said at least two physical layers as conductive connection layers assigned to a respective physical layer as two-dimensional circuit substrate or substrate layer.

21. The method of claim 1, wherein in the stored completed solutions in the database there are stored more properties in each set, as are selectable in the operating elements by view.

22. The method of claim 21, wherein in the stored solutions the properties that are not to be represented on the operating elements are individually blockable, wherein:
   (a) a blocked property relates to all solutions and in each set the same property is blocked;
   (b) the non-blocked properties determine the scale numbering in one of the operating elements.

23. The method of claim 1, wherein said plurality of completed solutions comprises more than 10 stored solutions.

24. The method of claim 1, wherein the representation in the real design space comprises at least the following:
   the components of the integration task;
   position and orientation of each of the components in one physical layer of the selected solution.

25. The method of claim 1, wherein each of said plurality of stored solutions comprises as a further property the number and position of thermal hot spots.

26. The method of claim 1, wherein each stored solution comprises as a further property an indication about one of
   a signal propagation time, a signal delay and a signal integrity.

27. The method of claim 1, wherein each of the stored solutions comprises a predicted reliability as a further property.

28. The method of claim 1, wherein each of the stored solutions completed solutions comprises as a further property a position presetting for a subset of said plurality of electric or electronic components.

29. The method of claim 1, wherein each of the stored solutions comprises the impedance of the conductors for connecting the electric or electronic components as a further property.

30. The method of claim 1, wherein each of the completed solutions comprises as a further property: an indication about separation of different supplies, a potential equalization between said several supplies or a current capability of at least one supply.

31. The method of claim 1, wherein each set of properties comprises as a further property as pre-calculated completed solution one, two or more of the following properties:
   a placing condition for at least some of the components;
   a timing indication for at least one used signal;
   a thermal indication; and
   a property of the overall circuit.

32. The method of claim 1, wherein each stored solution comprises as a further property in the set of properties for a number of at least two layers of conductors or lines, comprises a number of vertical wirings or vias.

33. The method of claim 1, wherein each solution comprises a further property as wiring density.

34. The method of claim 1, wherein each solution comprises a further property as wiring capacitance.

35. The method of claim 1, wherein said plurality of electric or electronic components also comprises electro-mechanical components.

36. The method of claim 1, wherein the change from one completed solution to another completed solution, both of which are available in the database in a pre-calculated manner and are parts of the destination space, is effected by changing a property of the set of properties.

37. The method of claim 1, wherein in a first portion of the display device the properties are visibly represented, and a respective scale represents only one property, and on said respective scale the same property values of the completed solutions stored in the database are individually visible.

38. The method of claim 37, wherein the several scales extend in parallel to each other.

39. The method of claim 37, wherein on one of the scales at least two different integration technologies are represented, as one of the properties from each set of properties.

40. The method of claim 1, wherein several technologies of integration are stored in the completed solutions, but only few thereof are enabled or have been enabled for the representation in the first operating element.

41. The method of claim 1, wherein only two or only three properties are represented versus each other in the second portion.

42. The method of claim 1, wherein for the purpose of a constraint management the set of properties is supplemented by one or more of the following properties, for each of the stored solutions:
   number of violations of a preset timing behavior;
   number of violations of a preset temperature profile; and
   for representation versus a another property in a second portion of the display device as the second operating element.

43. The method of claim 42, wherein said another property in the second portion from the set of represented properties is switchable or selectable.

44. The method of claim 1, wherein for the purpose of a constraint management each set of properties in each of the stored solutions is supplemented by the following property:
   number of extracted RC values from many present nets in the same stored solution in the destination space; and
   for representation versus another property in a second portion of the display device as the second, operating element.

45. The method of claim 1, wherein for the purpose of a constraint management each set of properties is supplemented by one or more of the following properties, for each of the stored solutions:
   number and size of deviations from preset line lengths in the sense of a differential line routing;
   number and strength of a signal cross talk;

number and strength of signal distortions in the sense of preserving signal integrity;

number and strength of deviations from preset line impedances; and for representation versus another a second portion of the display device as the second operating element.

46. The method of claim 1, wherein in a second portion of the display device a continuous part between two spaced, non-intersecting and pre-determinable functions is provided, for selecting only such solutions having a property value in said part.

47. The method of claim 1, wherein in an interactive function, from a starting point representing a solution, both represented properties of this solution in a second section of the representation device are concurrently improved to a next solution, wherein a close as possible next solution is determined by calculation, which avoids a significant change with respect to the starting point of each of the two represented properties.

48. The method of claim 1, wherein the set of properties of each solution is supplemented by a further property, which aggregates several properties that are comparable to each other.

49. The method of claim 1, wherein the set of properties is supplemented by a further property that itself has only a locally restricted meaning.

50. The method of claim 49, wherein said further property with local meaning is intended for a portion of the design or design area of not more than 20%, in particular for local heat generation or local wiring length.

51. The method of claim 1, wherein the spatial arranging for each component comprises as localization the respective location in space and position;

the respective orientation of the position;

and this indication is also defined for all of the remaining components.

52. The method of claim 1, wherein the influencing of the selecting is effected for a first design for a given integration task.

53. The method of claim 52, wherein the first design is influenced, but is re-correctable or re-designable later, for determining of the best possible result.

54. The method of claim 1, wherein it is primarily selected with respect to properties in the destination space as technology of the integration.

55. The method of claim 1, wherein said selectable solution represents a best possible result.

* * * * *

UNITED STATES PATENT AND TRADEMARK OFFICE
CERTIFICATE OF CORRECTION

PATENT NO.       : 8,645,900 B2
APPLICATION NO. : 12/599115
DATED            : February 4, 2014
INVENTOR(S)      : Schroeder et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 691 days.

Signed and Sealed this
Twenty-ninth Day of September, 2015

Michelle K. Lee
*Director of the United States Patent and Trademark Office*